(12) United States Patent
Jiang et al.

(10) Patent No.: US 8,227,328 B2
(45) Date of Patent: Jul. 24, 2012

(54) ER DOPED III-NITRIDE MATERIALS AND DEVICES SYNTHESIZED BY MOCVD

(76) Inventors: Hongxing Jiang, Manhattan, KS (US); Jingyu Lin, Manhattan, KS (US); Cris Ugolini, Manhattan, KS (US); John Zavada, Durham, NC (US)

( * ) Notice: Subject to any disclaimer, the term of this patent is extended or adjusted under 35 U.S.C. 154(b) by 263 days.

(21) Appl. No.: 12/375,187

(22) PCT Filed: Aug. 24, 2007

(86) PCT No.: PCT/US2007/076787
§ 371 (c)(1),
(2), (4) Date: Nov. 20, 2009

(87) PCT Pub. No.: WO2008/024991
PCT Pub. Date: Feb. 28, 2008

(65) Prior Publication Data
US 2010/0320443 A1    Dec. 23, 2010

Related U.S. Application Data

(60) Provisional application No. 60/823,465, filed on Aug. 24, 2006.

(51) Int. Cl.
*H01L 21/20* (2006.01)
(52) U.S. Cl. ............ 438/507; 438/22; 438/48; 438/508; 438/514; 257/E21.478

(58) Field of Classification Search .................... 257/79, 257/94, 101, 102; 438/22, 48, 507, 508, 438/514
See application file for complete search history.

(56) References Cited

U.S. PATENT DOCUMENTS

| | | | |
|---|---|---|---|
| 6,406,930 B2 | 6/2002 | Birkhahn et al. | |
| 7,118,928 B2* | 10/2006 | Steckl et al. | 438/22 |
| 2004/0135136 A1* | 7/2004 | Takahashi et al. | 257/14 |
| 2004/0208218 A1* | 10/2004 | Kondo et al. | 372/73 |
| 2004/0218259 A1 | 11/2004 | Hui et al. | |

OTHER PUBLICATIONS

Jiang, et al. "III-Nitrides Show Promises for Telecom Wavelengths," Laser Focus World., vol. 39, No. 11, pp. S8-S11, Nov. 2003.
International Search Report and Written Opinion issued in parent application PCT/US2007176787, dated Apr. 4, 2008, 8 pages.

* cited by examiner

*Primary Examiner* — Wai Sing Louie
(74) *Attorney, Agent, or Firm* — Lathrop & Gage LLP

(57) ABSTRACT

This disclosure relates to the synthesis of Er doped GaN epilayers by in-situ doping by metal-organic chemical vapor deposition (MOCVD). In an embodiment, both above and below bandgap excitation results in a sharp PL emission peak at 1.54 μm. Contrary with other growth methods, MOCVD grown Er-doped GaN epilayers exhibit virtually no visible emission lines, an present a small thermal quenching effect. The Er incorporation has very little effect on the electrical conductivity of the GaN epilayers and Er doped layers retain similar electrical properties as those of undoped GaN.

10 Claims, 20 Drawing Sheets

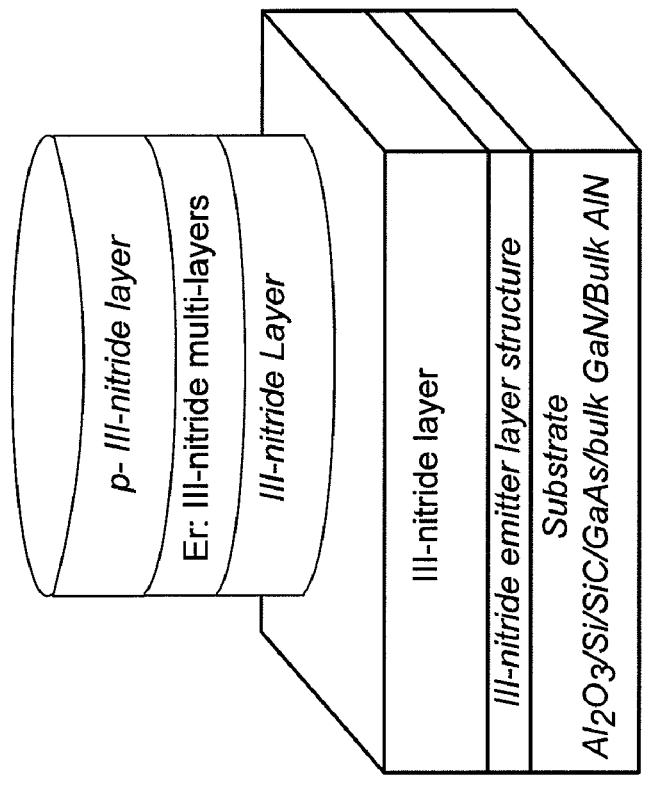
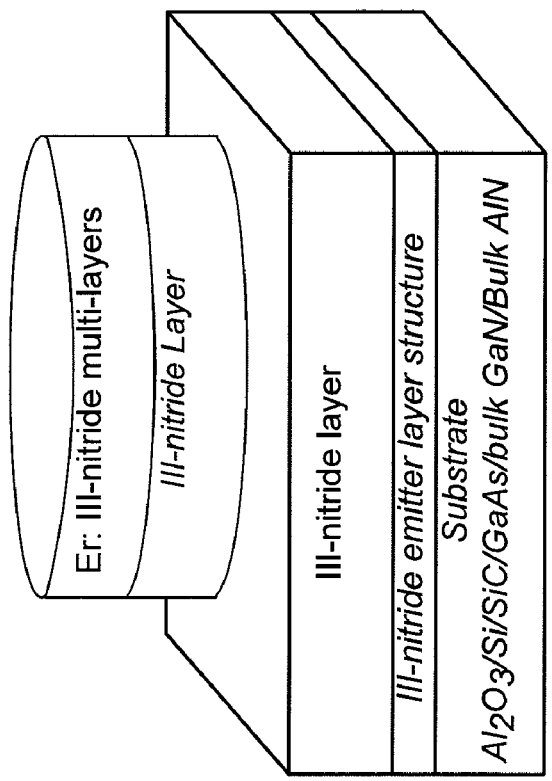
FIG 13

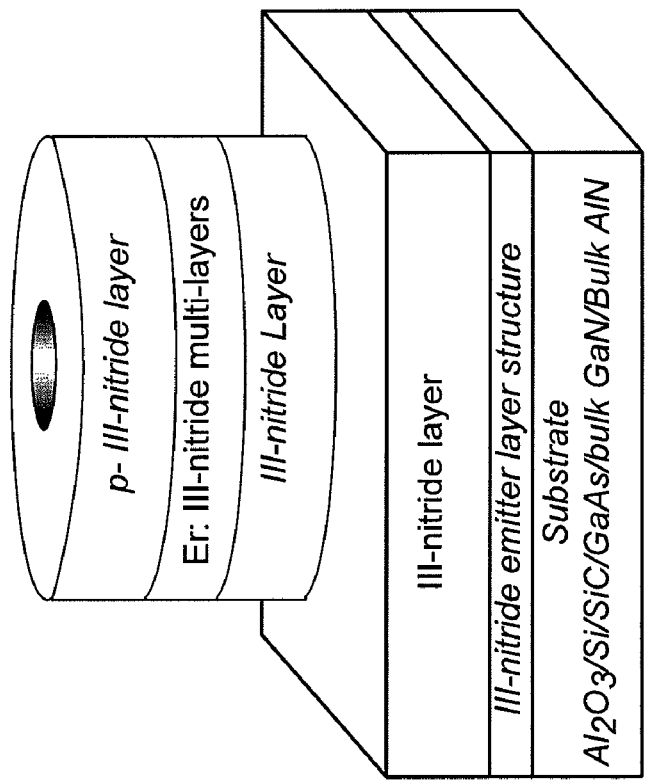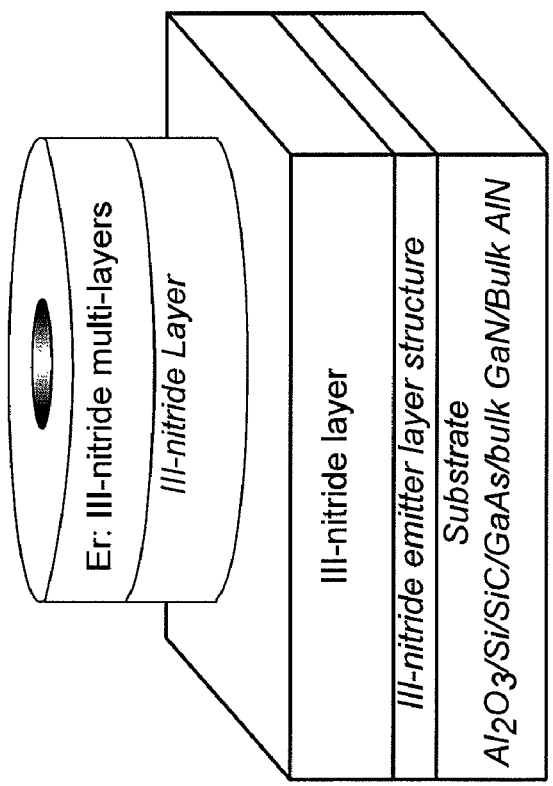
FIG 14

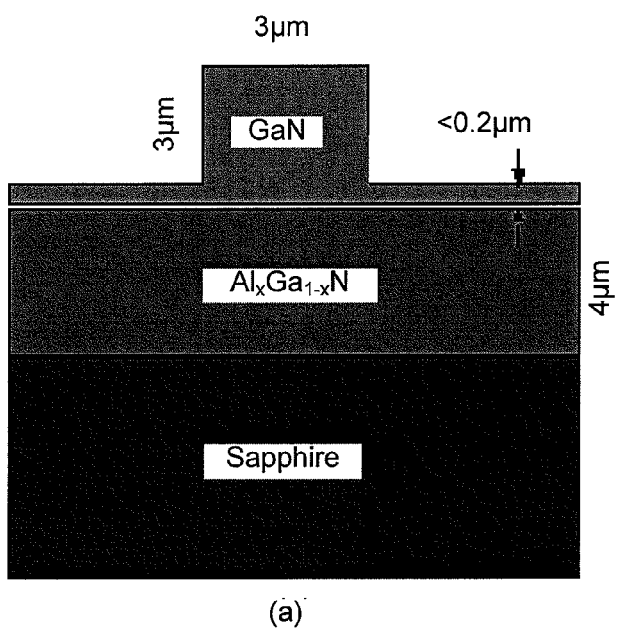
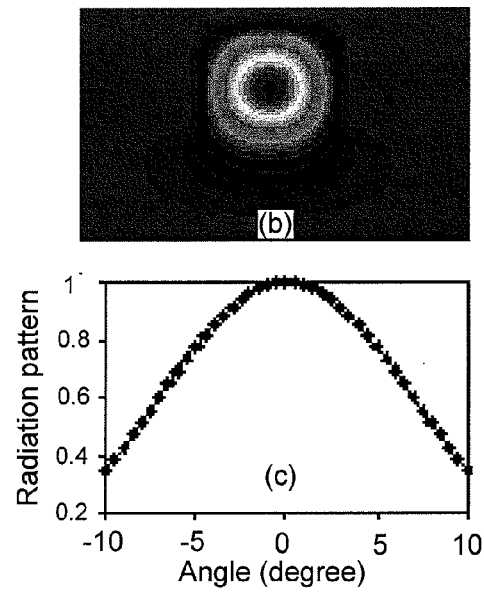
FIG 24A
FIG 24B
FIG 24C
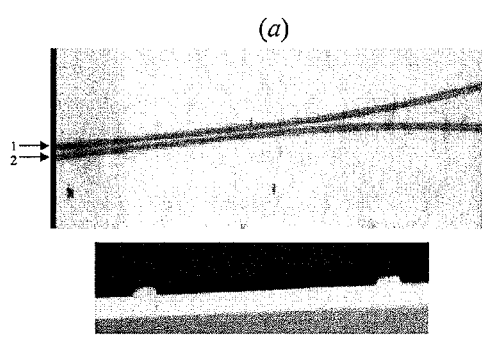
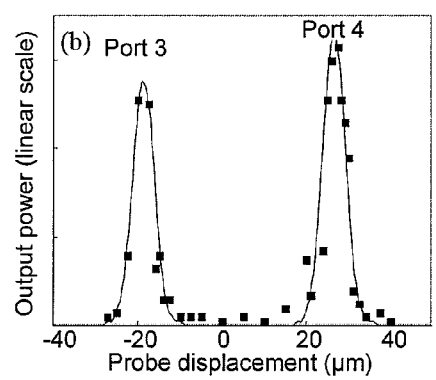
FIG 25A
FIG 25B (a)

(b)

(c)

(a)

(b)

ER DOPED III-NITRIDE MATERIALS AND DEVICES SYNTHESIZED BY MOCVD

RELATED APPLICATIONS

This application claims the benefit of U.S. Provisional Patent Application No. 60/823,465 filed Aug. 24, 2006.

BACKGROUND OF THE INVENTION

Incorporation of rare-earth atoms into a semiconductor host has received much attention recently due to the potential applications of rare-earth doped materials as efficient optical amplifiers and light-emitters. The outer 5s and 5p shells shield the inner 4f electrons from the surrounding environment, allowing the energy levels of the 4f shell to remain relatively unperturbed when placed into a solid host. By choosing the appropriate rare-earth element, it is possible to create very sharp, temperature-stable light emission based upon intra-4f transitions. A majority of the research done for rare-earth doping has been devoted to the element Er, since one of its 4f transitions produces emission at wavelength (1.54 µm) that corresponds to a minimum loss in modern silica fibers for optical communications. Much of the early work for Er doped III-V semiconductors focused primarily on the known compounds of GaAs, GaP, InP, and Si.[4-6] Ennen et al. successfully incorporated Er into these semiconductors by ion-implantation, but the reported quantum efficiency was not of the order acceptable for commercial applications.[5] Favennec et al, later showed that the emission efficiency of the intra-4f transitions depends strongly upon the bandgap of the host semiconductor.[6] By using ion implantation to incorporate Er into semiconductors with a large diversity of bandgap energies, it was shown that a subsequent thermal quenching of the rare-earth emission occurs for the semiconductors with smaller bandgaps. It has also been suggested that the neighboring environment created by more ionic host semiconductors increases the intra-4f $Er^{3+}$ transitions.[1,7] In light of these properties, GaN is an optimum host for Er since it has a bandgap of 3.4 eV, and an electronegativity difference of –1.2.

Much work has been dedicated to the incorporation of Er into GaN by methods such as ion-implantation, hydride vapor phase epitaxy (HVPE), metal organic molecular beam epitaxy (MOMBE), and molecular beam epitaxy (MBE). There are reports of successful Er incorporation, leading to devices, such as light emitting diodes (LEDs), that produce wavelengths ranging from the visible to infrared. But all such devices still suffer either from strong emission lines in the visible region and/or from a low quantum efficiency at the IR wavelengths, severely limiting their prospects for practical device applications in telecommunication systems.

BRIEF DESCRIPTION OF THE DRAWINGS

FIGS. 1-17 show perspective views of embodiments for general III-Nitride structures according to the present subject matter.

FIGS. 24-27 show embodiments and properties.

DETAILED DESCRIPTION

This disclosure relates to the synthesis of Er doped GaN epilayers by in-situ doping by metal-organic chemical vapor deposition (MOCVD). The optical and electrical properties of the Er doped GaN epilayers were studied by photoluminescence (PL) spectroscopy and Van der Pauw Hall method. Both above and below bandgap excitation results in a sharp PL emission peak at 1.54 µm. In contrary with other growth methods, MOCVD grown Er-doped GaN epilayers exhibit virtually no visible emission lines. A small thermal quenching effect, with only a 20% decrease in the integrated intensity of the 1.54 µm PL emission, occurred between 10 and 300 K. It was found that Er incorporation has very little effect on the electrical conductivity of the GaN epilayers and Er doped layers retain similar electrical properties as those of undoped GaN.

Er doped GaN obtained by in-situ incorporation by metal-organic chemical vapor deposition (MOCVD) has not been experimentally realized, even though devices, such as LEDs, based upon MOCVD synthesized GaN are among the highest quality. The difficulty in producing Er doped GaN by the MOCVD process stems from the chemical nature of the metal organic Er precursor. To date, metal organic Er precursors have low vapor pressures at room temperature and/or large organic chains containing elements that are parasitic to the quality of III-nitrides. But, due to novel MOCVD engineering, we have achieved such Er doped III-nitride materials and device structures by the MOCVD method.

The present subject matter relates to the synthesis of Er doped III-nitride materials grown by metal organic chemical vapor deposition, and devices of light emitters, waveguides, and optical amplifiers (both optical and current injected), operating at the telecommunication wavelength (1.54 µn), based upon such Er doped III-nitride materials.

The present application pertains to the synthesis of Er doped III-nitride materials by metal organic chemical vapor deposition (MOCVD), and devices operating at the telecommunication wavelength (1.54 µm) based upon such Er doped III-nitride materials. Such devices operating at 1.54 µm are, but are not limited to, waveguides, light emitters, and optical amplifiers (excitation schemes for such devices include both optical and current injection).

Figure 2:
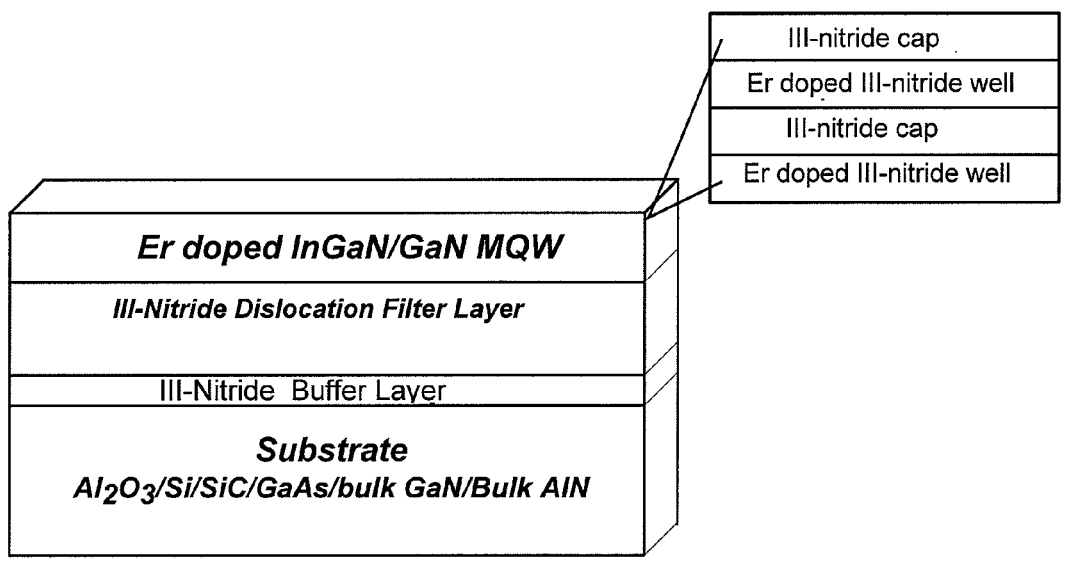
Figure 18:
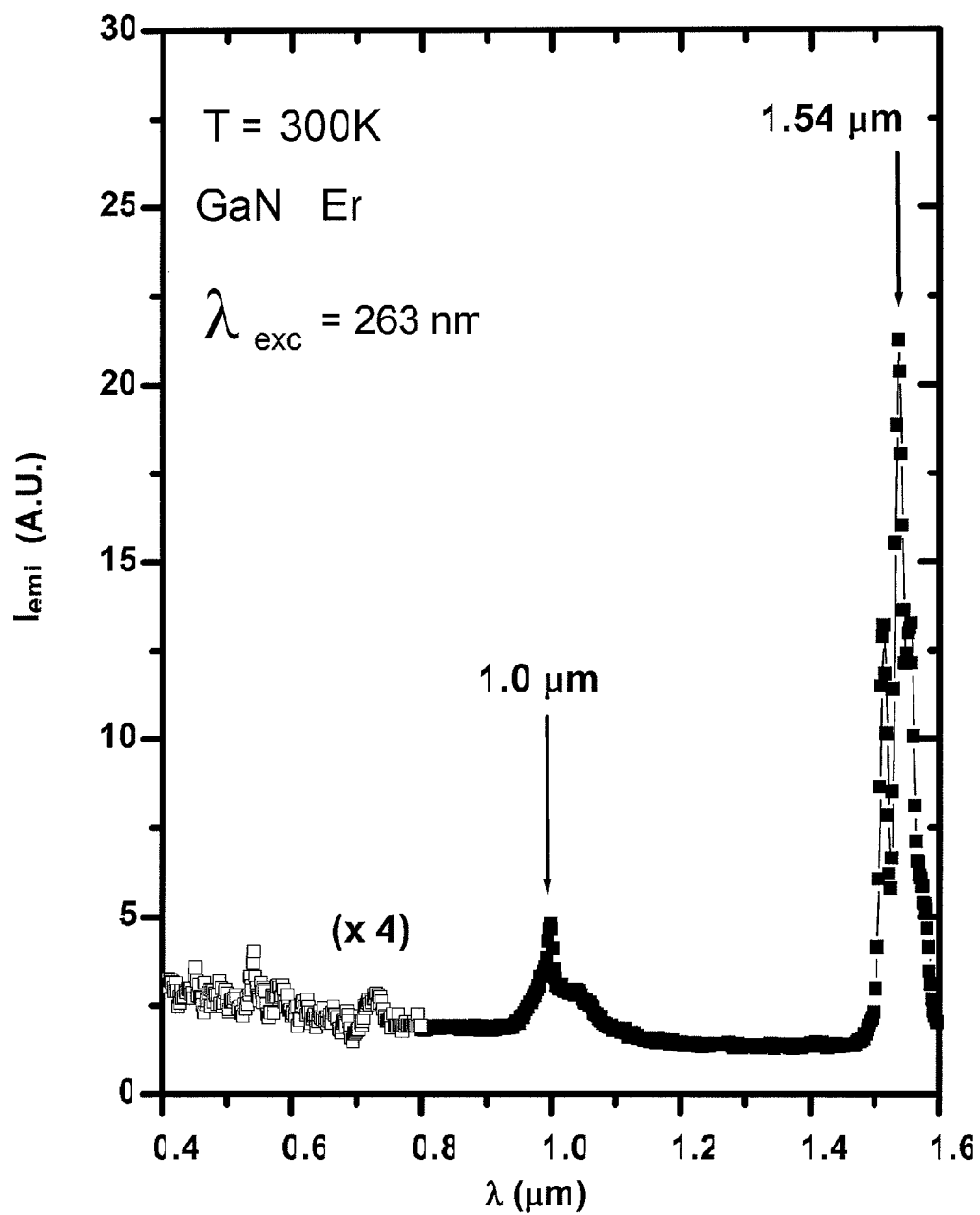
FIG. 18 shows a plot of emission intversus wavelength for embodiments.

Thus, this disclosure relates to the in-situ incorporation of Er into GaN epilayers by MOCVD, and their electrical and optical properties. The Er doped GaN epilayers were synthesized by MOCVD in a horizontal reactor. Trimethylgallium was used for the Ga source, and blue $NH_3$ was used as the N source. The metalorganic precursor used for the in-situ Er doping was Tris(2,2,6,6-tetramethyl-3,5-heptanedionato)erbium, which was transported to the reactor by $H_2$. All samples were grown on (0001) sapphire substrates. The growth of these epilayers began with a thin GaN buffer layer, followed by a 1.2 µm GaN epilayer template and a 0.5 µm Er doped GaN layer. The growth temperature of the GaN template and Er doped GaN layer was 1040° C. A UV photoluminescence (PL) spectroscopy system was employed to study the optical properties of the Er doped GaN. The PL system consists of a frequency doubled and tripled, 100 fs Ti:sapphire laser operating at an average power of 150 mW at 263 nm and 395 nm, and a repetition rate of 76 MHz. IR detection was accomplished by an InGaAs detector, while visible PL detection was accomplished by a multi-channel plate photomultiplier tube, in conjunction with a 1.3 m monochromator and a typical PL spectrum is depicted in FIG. 18. Room temperature transport properties of these films were measured by Van der Pauw Hall method. Secondary-ion mass spectroscopy (SIMS) was performed by Evans Analytical Group to profile the Er concentration. The inset of FIG. 2 shows the Er profile for one of our Er-doped GaN epilayers as probed by SIMS.

Figure 19:
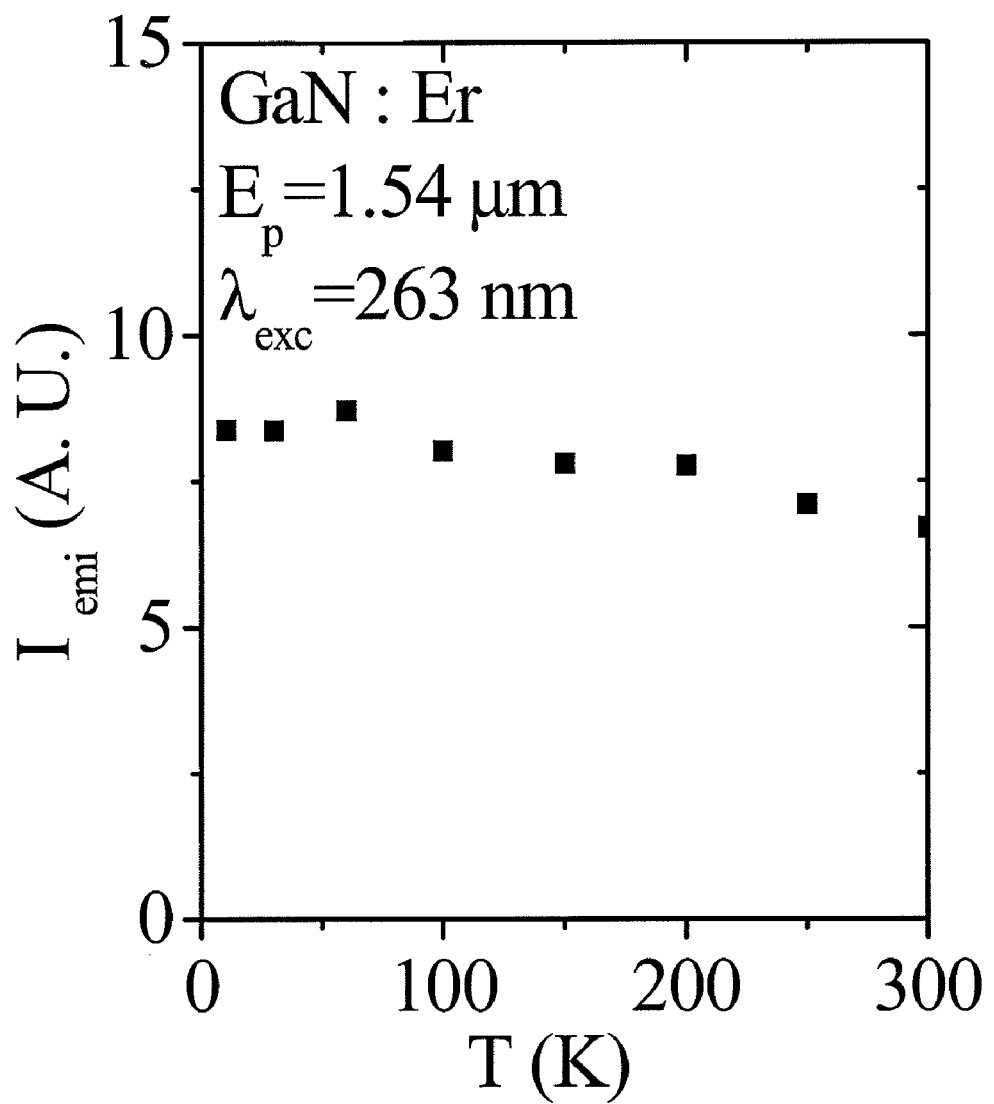
FIG. 19 plots emission versus sample temperatures for embodiments.

FIG. 18 is a room temperature PL spectrum of Er doped GaN covering wavelengths from the visible to IR region, for an excitation wavelength ($\lambda_{exc}$) of 263 nm. Two sharp emission peaks are observed at wavelengths of 1.0 and 1.54 μm (with a full width at half maximum of 10.2 and 11.8 nm) corresponding to the radiative intra-4f $Er^{3+}$ transitions from the $^4I_{11/2}$ (second excited state) and the $^4I_{13/2}$ (first excited state) to the $^4I_{15/2}$ (ground state), respectively. The room temperature PL intensity of the 1.54 μm peak is much larger than that of the 1.0 μm emission line. FIG. 18 also shows that virtually no visible emission lines can be observed in Er-doped GaN epilayers grown by MOCVD. This is in sharp contrast to the results of Er-doped GaN obtained by MBE or ion-implantation, which exhibit the dominant intra-4f $Er^{3+}$ transitions to be from the $^2H_{11/2}$ (537 nm) and $^4S_{3/2}$ (558 nm) to the $^4I_{15/2}$[12,15] ground state. In FIG. 19 is shown the high degree of thermal stability of the $Er^{3+}$ emission. The integrated PL intensity of the 1.54 μm emission decreases between 10 and 300 K by only 20%. This low degree of thermal quenching is in good agreement with previous results of Favennec et al [4] and represents the lowest reported value for Er-doped GaN [9]. These results clearly demonstrate the high potential of MOCVD grown Er-doped GaN epilayers for optical communications devices.

Figure 22:
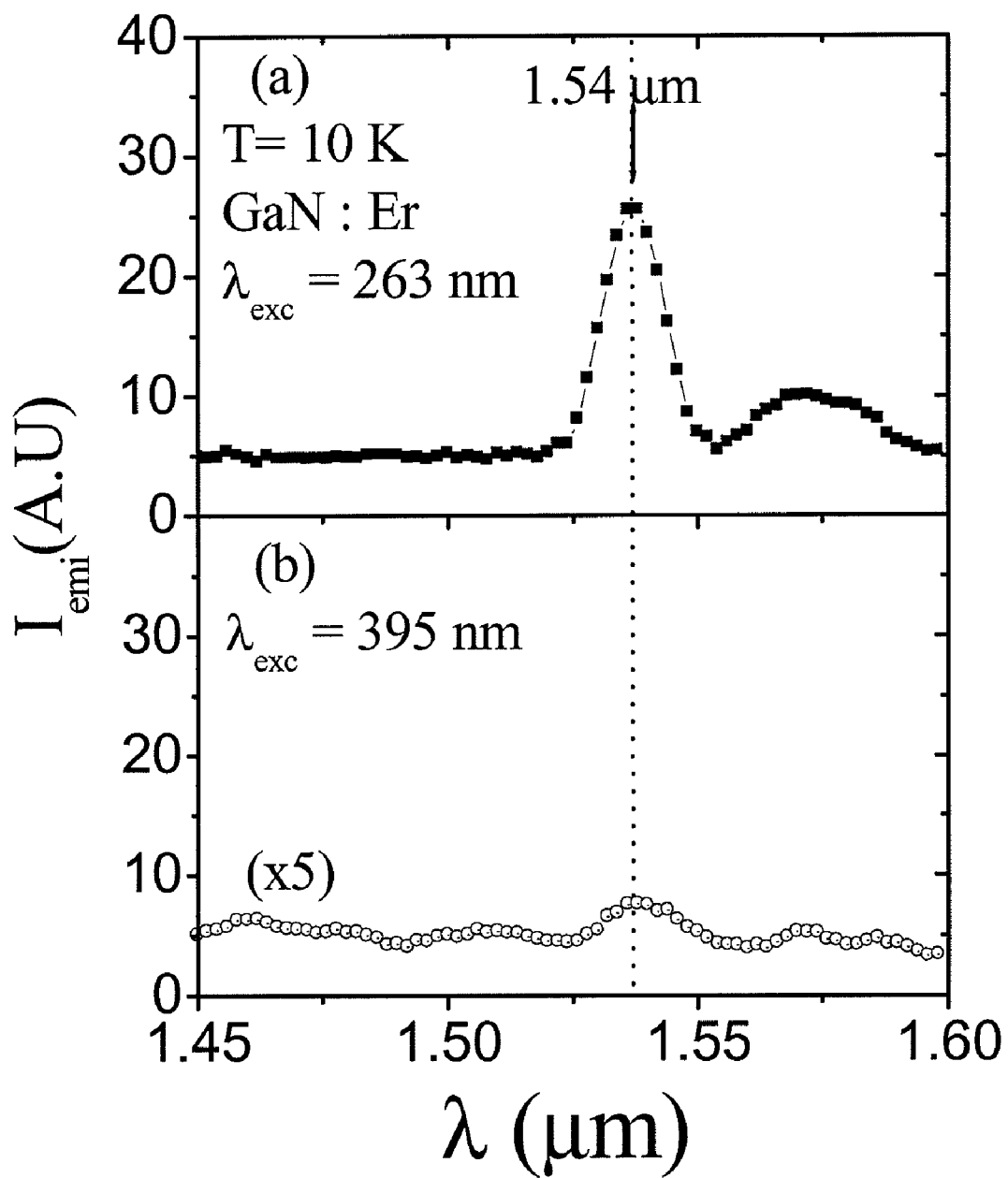
FIG. 22 shows emission versus wavelength for other embodiments.

In FIG. 22 is a comparison of the PL spectra of Er-doped GaN at 10 K, with above bandgap excitation ($\lambda_{exc}$=263) and below bandgap excitation ($\lambda_{exc}$=395 nm). It is observed that the PL intensity of the 1.54 μm emission with $\lambda_{exc}$=263 nm excitation is 10 times larger than that with $\lambda_{exc}$=395 nm. It is apparent that the above bandgap excitation is much more efficient for the 1.54 μm emission. This result indicates that the generation of electron-hole (e-h) pairs results in a more efficient energy transfer to Er centers than through defect centers in the epilayers [16]. Thus, optical amplifiers and emitters operating at 1.54 μm may be more efficient by employing an above bandgap excitation scheme.

Figure 23:
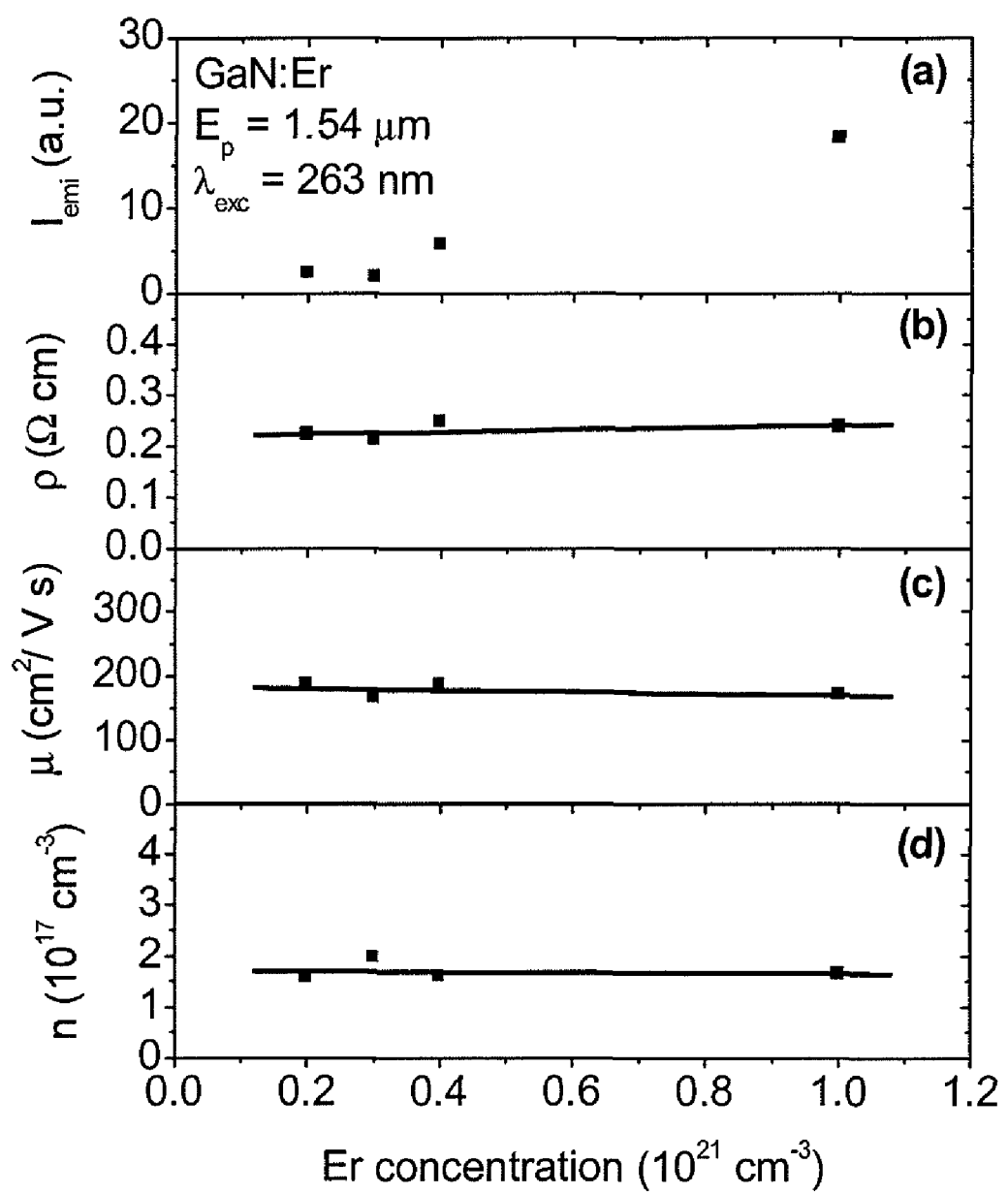
FIG. 23 plots (a) resistivity (ρ), (b) electron mobility (µ), (c) free electron concentration (n), and intensity versus Er concentration for embodiments.

An important consideration for the realization of practical optoelectronic devices is the effect of Er incorporation on the electrical properties of GaN. Doping of GaN with Er may introduce defects that are a detriment to the required electrical conductivity. In FIG. 23, we plot optical and electrical properties (integrated PL emission intensity of the 1.54 μm peak, resistivity, electron mobility, and free electron concentration) of Er-doped GaN epilayers as a function of Er concentrations between $(0.2-1) \times 10^{21}$ cm$^{-3}$. The electrical properties were determined by Hall effect measurement. As can be seen in FIG. 23, the electron mobility, concentration, and resistivity are relatively unchanged with an increase in Er concentration. In fact, the values of mobility (~200 cm$^2$/V s), electron concentration (~$2 \times 10^{17}$ cm$^{-3}$), and resistivity (~0.2 Ω cm) are comparable to those of high-quality undoped MOCVD GaN (400 cm$^2$/V s, $2 \times 10^{17}$ cm$^{-3}$, 0.05 Ω cm). The only noticeable difference is the smaller mobility of the Er doped samples.

These results can be explained if we consider the bonding nature of Er within a GaN host. It has been reported that the majority of Er atoms occupy the Ga site within the hexagonal wurtzite structure [1]. It is also known that the normal charge state of bonding of Er inside an ionic host is $Er^{3+}$ [18,19], which is the same as that of Ga inside the hexagonal wurtzite structure. This implies that the incorporation of Er centers into GaN is essentially isoelectronic doping, and should not affect the free electron concentration. However, Er atoms will act as scattering centers, thereby slightly reducing the electron mobility. Depicted in FIG. 18 is a plot of the integrated PL intensity of the 1.54 μm emission vs. Er concentration with $\lambda_{exc}$=263 nm. The emission intensity of the 1.54 μm peak does increase with increasing Er concentration.

In summary, Er-doped GaN epilayers have been synthesized with in-situ doping by MOCVD. PL results showed that both above and below bandgap excitation produces emission at 1.54 μm whose intensity increases with higher Er concentration. The Er emission at 1.54 μm in GaN has a high degree of thermal stability; the decrease in emission intensity between 10 and 300 K was only about 20%. PL results also indicated that above bandgap excitation is much more efficient for $Er^{3+}$ emission at 1.54 μm. Hall effect measurements revealed that Er-doped GaN epilayers have comparable electrical properties to those of high-quality undoped GaN. These results, together with the absence of virtually any visible PL emission lines, demonstrate the very high potential of these materials for applications in optoelectronic devices operating at the main telecommunication wavelength of 1.54 μm.

In one embodiment, Er doped III-nitride materials are synthesized by MOCVD for application in devices operating at 1.54 μm. Such Er doped III-nitride materials cover the entire alloy range of the III-nitride system, $Al_xGa_{1-x}N$, $In_xGa_{1-x}N$, $In_xAl_{1-x}N$, and $In_xAl_yGa_{1-x-y}N$ for x, y=0 to 1, and are grown on the usual substrates suitable for MOCVD growth of III-nitrides ($Al_2O_3$, Si, SiC, GaAs, bulk GaN and bulk AlN).

In one embodiment, Er doped III-nitride single and multiple quantum well (MQW) structures are synthesized by MOCVD for applications in optical communication devices operating at around 1.54 μm. Such Er doped III-nitride materials cover the entire alloy range of the III-nitride system, $Al_xGa_{1-x}N$, $In_xGa_{1-x}N$, $In_xAl_{1-x}N$, and $In_xAl_yGa_{1-x-y}N$ for x, y=0 to 1, and are grown on the usual substrates suitable for MOCVD growth of III-nitrides ($Al_2O_3$, Si, SiC, GaAs, bulk GaN and bulk AlN).

In one embodiment, a III-nitride visible emitter layer structure is grown on top of an Er doped III-nitride layer for emission of light at 1.54 μm. The visible light from the emitter stimulates the 1.54 μm emission from the Er atoms in the Er layer. The III-nitride emitter structure and Er layer covers the entire alloy range of the III-nitride system, $Al_xGa_{1-x}N$, $In_xGa_{1-x}N$, $In_xAl_{1-x}N$, and $In_xAl_yGa_{1-x-y}N$ for x, y=0 to 1, and are grown on the usual substrates suitable for MOCVD growth of III-nitrides ($Al_2O_3$, Si, SiC, GaAs, bulk GaN and bulk AlN).

In one embodiment, an Er doped III-nitride layer is grown on top of a III-nitride emitter layer structure for emission of light at 1.54 μm. The visible light from the emitter stimulates the 1.54 μm emission from the Er atoms in the Er layer. The III-nitride emitter layer structure and Er layer covers the entire alloy range of the III-nitride system, $Al_xGa_{1-x}N$, $In_xGa_{1-x}N$, $In_xAl_{1-x}N$, and $In_xAl_yGa_{1-x-y}N$ for x, y=0 to 1, and are grown on the usual substrates suitable for MOCVD growth of III-nitrides ($Al_2O_3$, Si, SiC, GaAs, bulk GaN and bulk AlN).

In one embodiment, an Er doped quantum well region (or the active region) is buried inside a III-nitride emitter layer structure (or a III-nitride p-n junction) for emission of light at 1.54 μm. The electron-hole pairs and visible light generated by the emitter (or the p-n junction) stimulates the 1.54 μm emission from the Er atoms in the QW region. The III-nitride emitter and QW covers the entire alloy range of the III-nitride system, $Al_xGa_{1-x}N$, $In_xGa_{1-x}N$, $In_xAl_{1-x}N$, and $In_xAl_yGa_{1-x-y}N$ for x, y=0 to 1, and are grown on the usual substrates suitable for MOCVD growth of III-nitrides ($Al_2O_3$, Si, SiC, GaAs, bulk GaN and bulk AlN).

In one embodiment, Er doped III-nitride materials and structures synthesized by MOCVD are used for fabricating devices for application in optical amplifiers operating at 1.54 μm under optical or current injection. The amplifier geometries are chosen so as to support the telecommunication wavelength (1.54 μm). Such Er doped III-nitride amplifier structures cover the entire alloy range of the III-nitride system, $Al_xGa_{1-x}N$, $In_xGa_{1-x}N$, $In_xAl_{1-x}N$, and $In_xAl_yGa_{1-x-y}N$ for x, y=0 to 1, and are grown on the usual substrates suitable for MOCVD growth of III-nitrides ($Al_2O_3$, Si, SiC, GaAs, bulk GaN and bulk AlN).

In one embodiment, an optical amplifier for the telecommunication wavelength (1.54 μm) is made from an Er doped III-nitride waveguide structure in conjunction with an exterior light source. The amplification is achieved through stimulation of the Er doped nitride layers by the exterior light source. Such light sources are, but are not limited to, LEDs, lamps, and lasers. Such wavelengths of excitation are, but are not limited to, any wavelength within the UV/Blue/Green spectrum of the III-nitride emitter system, or 980 nm, 800 nm, 661 nm, 538 nm, 500 nm, 460 nm, and 410 nm provided by an external light source, which correspond to resonant absorption within the 4f shell of $Er^{3+}$. The waveguide geometries are chosen so as to support the telecommunication wavelength (1.54 μm). Such Er doped III-nitride waveguide structures cover the entire alloy range of the III-nitride system, $Al_xGa_{1-x}N$, $In_xGa_{1-x}N$, $In_xAl_{1-x}N$, and $In_xAl_yGa_{1-x-y}N$ for x, y=0 to 1, and are grown on the usual substrates suitable for MOCVD growth of III-nitrides ($Al_2O_3$, Si, SiC, GaAs, bulk GaN and bulk AlN).

In one embodiment, an optical amplifier for the telecommunication wavelength (1.54 μm) is made from a P—I—N structure using an Er doped III-nitride waveguide. The amplification is achieved through stimulation of the Er centers within the Er doped layer by current injection. The waveguide geometries are chosen so as to support the telecommunication wavelength (1.54 μm). Such Er doped III-nitride waveguide structures cover the entire alloy range of the III-nitride system, $Al_xGa_{1-x}N$, $In_xGa_{1-x}N$, $In_xAl_{1-x}N$, and $In_xAl_yGa_{1-x-y}N$ for x, y=0 to 1, and are grown on the usual substrates suitable for MOCVD growth of III-nitrides ($Al_2O_3$, Si, SiC, GaAs, bulk GaN and bulk AlN).

In one embodiment, monolithic integration of an optical amplifier for the telecommunication wavelength (1.54 μm) is achieved from the combination of an Er doped III-nitride waveguide structure and a III-nitride emitter that produce visible light. The amplification is achieved through stimulation of the Er doped layer (located either above or below the emitter structure) by the III-nitride visible emitter. The III-nitride emitter is grown on top of the Er doped waveguide, or on the opposite side of a substrate containing the Er doped waveguide. The waveguide geometries are chosen so as to support the telecommunication wavelength (1.54 μm). Such Er doped III-nitride waveguide structures cover the entire alloy range of the III-nitride system, $Al_xGa_{1-x}N$, $In_xGa_{1-x}N$, $In_xAl_{1-x}N$, and $In_xAl_yGa_{1-x-y}N$ for x, y=0 to 1, and are grown on the usual substrates suitable for MOCVD growth of III-nitrides ($Al_2O_3$, Si, SiC, GaAs, bulk GaN and bulk AlN).

In one embodiment, diffraction Bragg's reflection (DBR) mirrors are implemented into an Er based III-nitride emitter and amplifier structure to enhance the $Er^{3+}$ based emission. The DBR layers reflect the wavelengths of the pumping wavelength (emitter wavelength) and/or the signal wavelength (1.54 μm). Such pumping wavelengths are, but are not limited to, 410 nm, 460 nm, 500 nm, 538 nm, and 980 nm. Such Er doped III-nitride emitters and amplifiers cover the entire alloy range of the III-nitride system, $Al_xGa_{1-x}N$, $In_xGa_{1-x}N$, $In_xAl_{1-x}N$, and $In_xAl_yGa_{1-x-y}N$ for x, y=0 to 1, and are grown on the usual substrates suitable for MOCVD growth of III-nitrides ($Al_2O_3$, Si, SiC, GaAs, bulk GaN and bulk AlN).

In one embodiment, an Er doped quantum well region (or the active region) is buried inside a III-nitride nanoscale/microscale structure (a microscale/nanoscale-disk or -pillar or a microscale/nanoscale-ring) for emission of light at 1.54 μm. The micro/nanoscale structure may consist of a heterojunction or p-n junction and be excited either optically by an external light source, or electrically through current injection. Either mechanism will stimulate the Er atoms in the active region to emit light at 1.54 μm. These micro/nanoscale structures form the basic components for obtaining planar photonic integrated circuits active around 1.54 μm. These micro/nanoscale structures are also the basis of Er doped III-nitride microdisk or micro-ring lasers, vertical cavity surface emitting lasers, and photonic crystals (an array of pillars creates periodically varying refractive indices) active around 1.54 μm.

In an embodiment, for current injection optical amplifers, the amplifers are pumped by III-nitride emitters with emission wavelengths varying from 250-700 nm, while III-nitride emitters are current injection devices.

For all the layer and device structures based upon Er doped III-nitrides discussed above, the host materials for the Er elements cover the entire alloy range of the III-nitride system, $Al_xGa_{1-x}N$, $In_xGa_{1-x}N$, $In_xAl_{1-x}N$, and $In_xAl_yGa_{1-x-y}N$ for x, y=0 to 1, and are grown on the usual substrates suitable for MOCVD growth of III-nitrides, including $Al_2O_3$, SiC, GaAs, bulk GaN, bulk AlN and Si with different crystal orientations such as Si (001) and Si (111).

Figure 1:
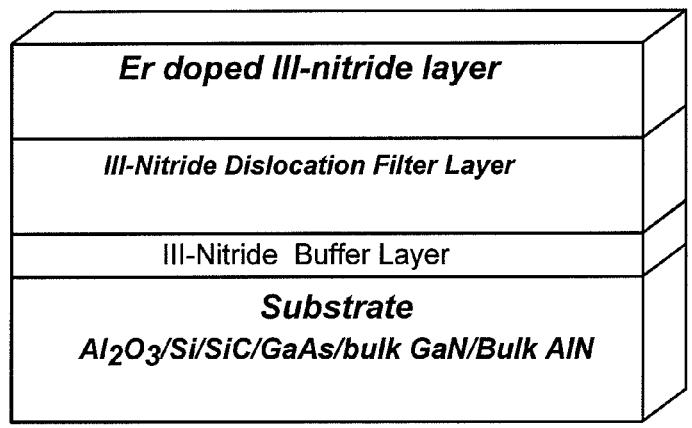

FIG. 1 General structure of an Er doped III-nitride epilayer synthesized by MOCVD according to one embodiment of the present subject matter.

FIG. 2 General structure of an Er doped III-nitride multiple quantum well (MQW) structure synthesized by MOCVD according to one embodiment of the present subject matter.

Figure 3:
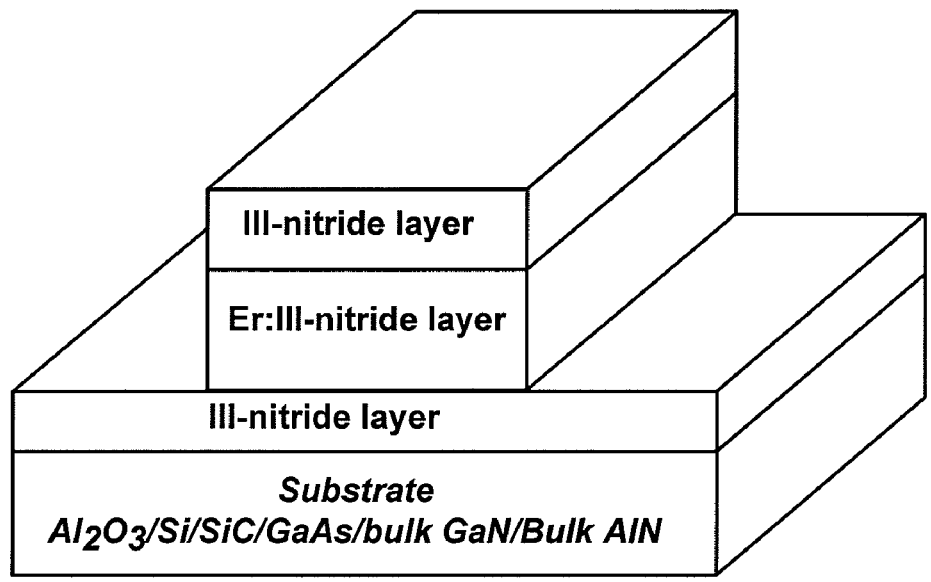

FIG. 3 General structure of an Er doped III-nitride waveguide structure for 1.54 □m wavelength according to one embodiment of the present subject matter.

Figure 4:
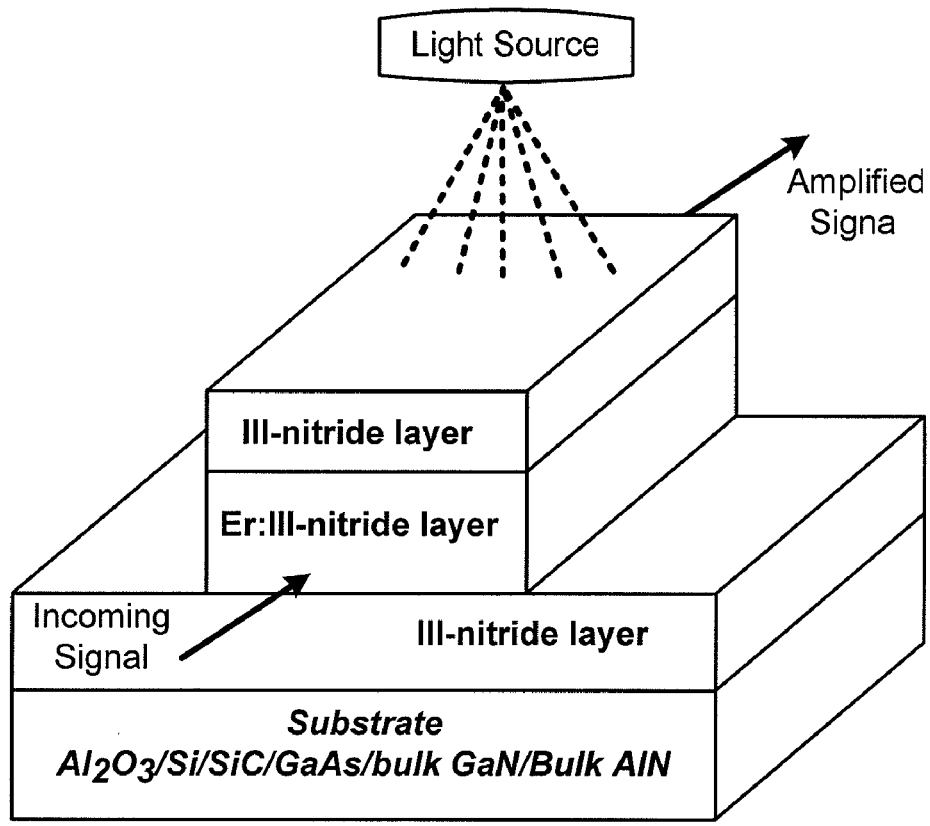

FIG. 4 General structure of an optically pumped, Er doped III-nitride optical amplifier for a 1.54 μm wavelength according to one embodiment of the present subject matter. The optical pumping is achieved by, but is not limited to, lamps, LEDs, and lasers. Of these light sources, wavelengths corresponding to the resonant absorption lines in the 4f shell of $Er^{3+}$ (980 nm, 800 nm, 661 nm, 538 nm, 500 nm, 460 nm, and 410 nm) are employed. The location of the external pumping source can be varied to achieve optimal performance.

Figure 5:
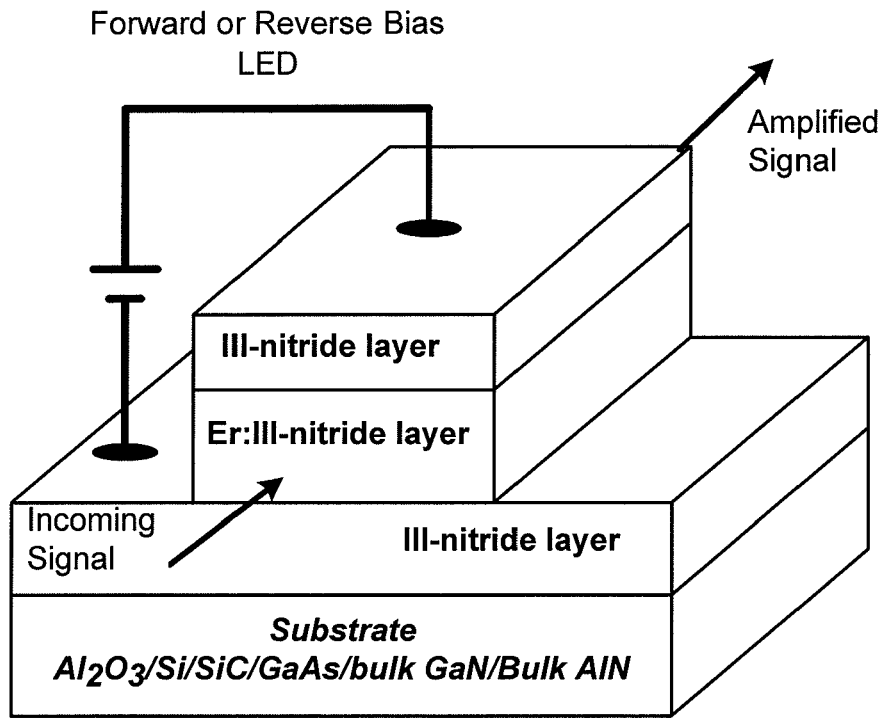

FIG. 5 General structure of a current injected Er doped III-nitride optical amplifier for 1.54 μm wavelength according to one embodiment of the present subject matter.

Figure 6:
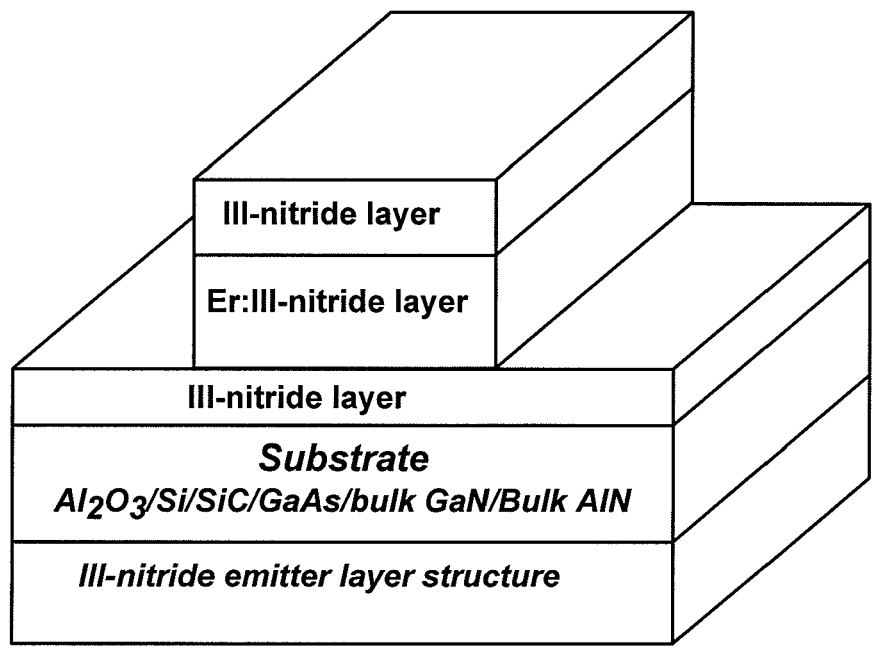

FIG. 6 General structure of monolithic integration of a current injected Er doped III-nitride amplifier for 1.54 μm wavelength, containing an Er doped waveguide and a III-nitride emitter grown on the opposite side of a double polished substrate, according to one embodiment of the present subject matter.

Figure 7:
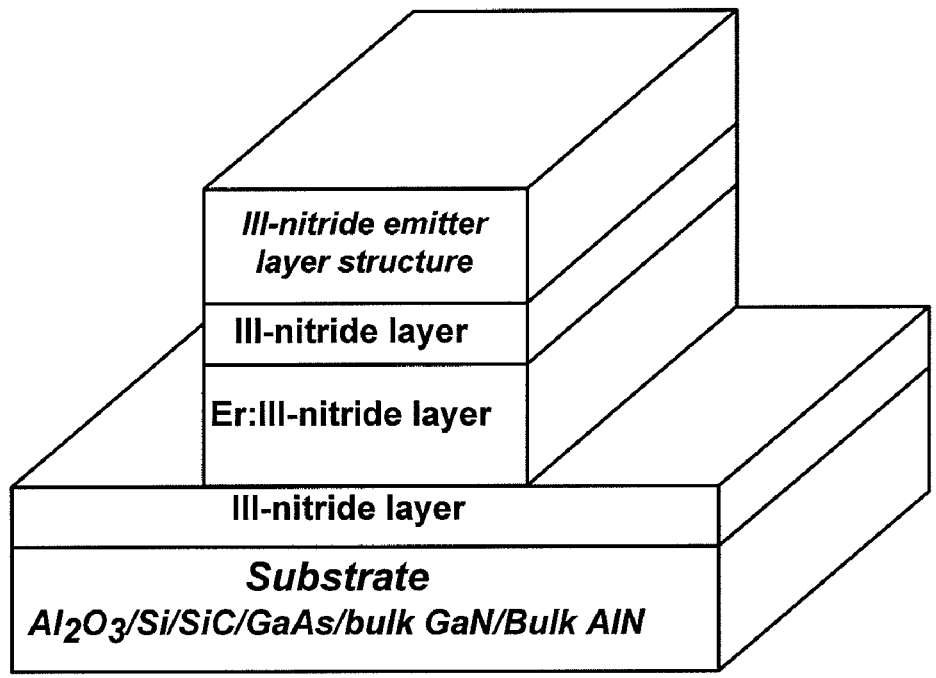

FIG. 7 General structure of monolithic integration of a current injected Er doped III-nitride optical amplifier for 1.54 µm wavelength, containing a III-nitride emitter grown on top of an Er doped III-nitride waveguide, according to one embodiment of the present subject matter.

Figure 8:
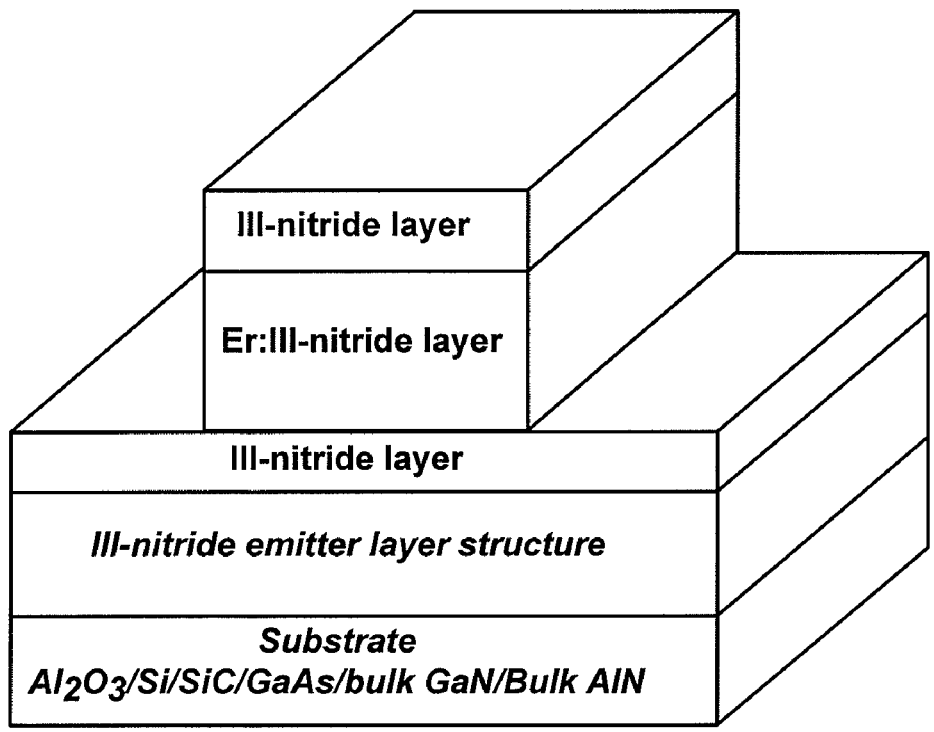

FIG. 8 General structure of monolithic integration of a current injected Er doped III-nitride optical amplifier for 1.54 µm wavelength, containing an Er doped III-nitride waveguide grown on top of a III-nitride emitter, according to one embodiment of the present subject matter.

Figure 9:
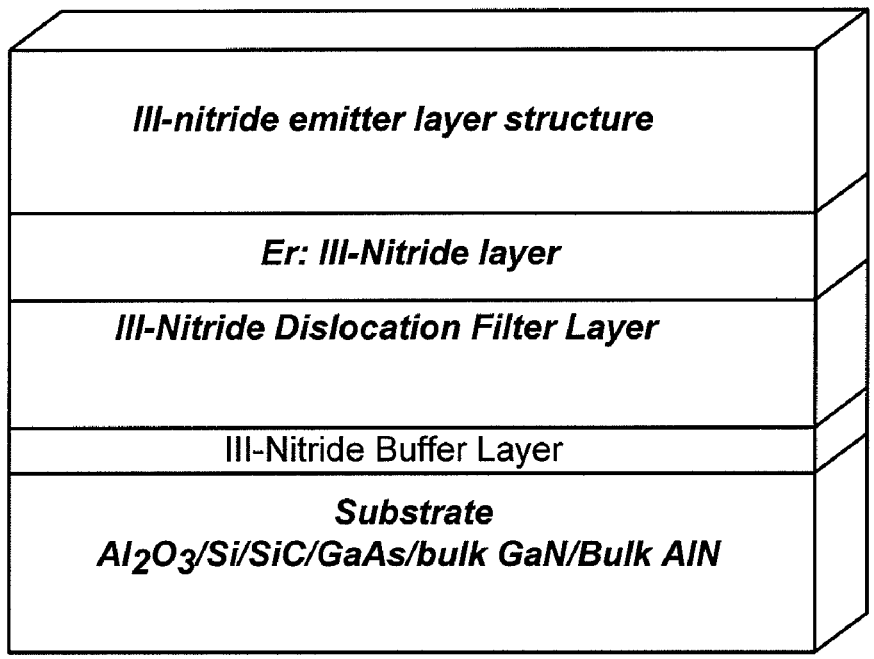

FIG. 9 General structure of III-nitride emitter grown on top of an Er doped III-nitride epilayer according to one embodiment of the present subject matter.

Figure 10:
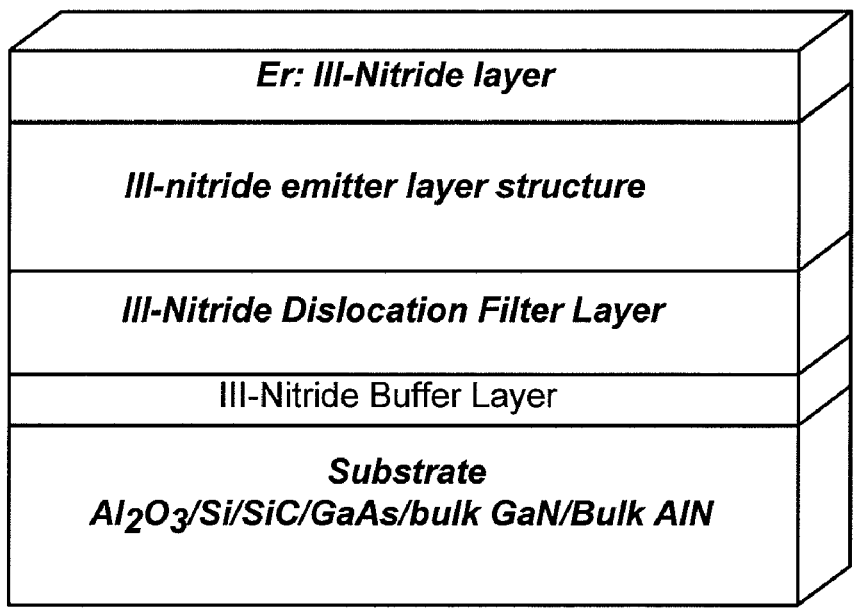

FIG. 10 General structure of an Er doped III-nitride epilayer grown on top of a III-nitride emitter according to one embodiment of the present subject matter.

Figure 11:
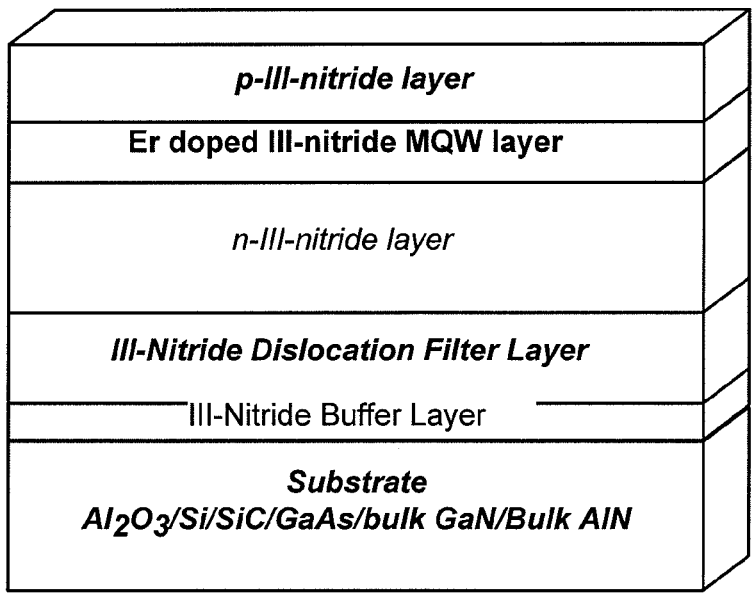

FIG. 11 General structure of an Er doped III-nitride MQW optical active region buried inside a III-nitride emitter structure (or a III-nitride p-n junction) according to one embodiment of the present subject matter. This is one of the basic layer structures of light sources (LEDs and lasers) that produce 1.54 µm emission.

Figure 12:
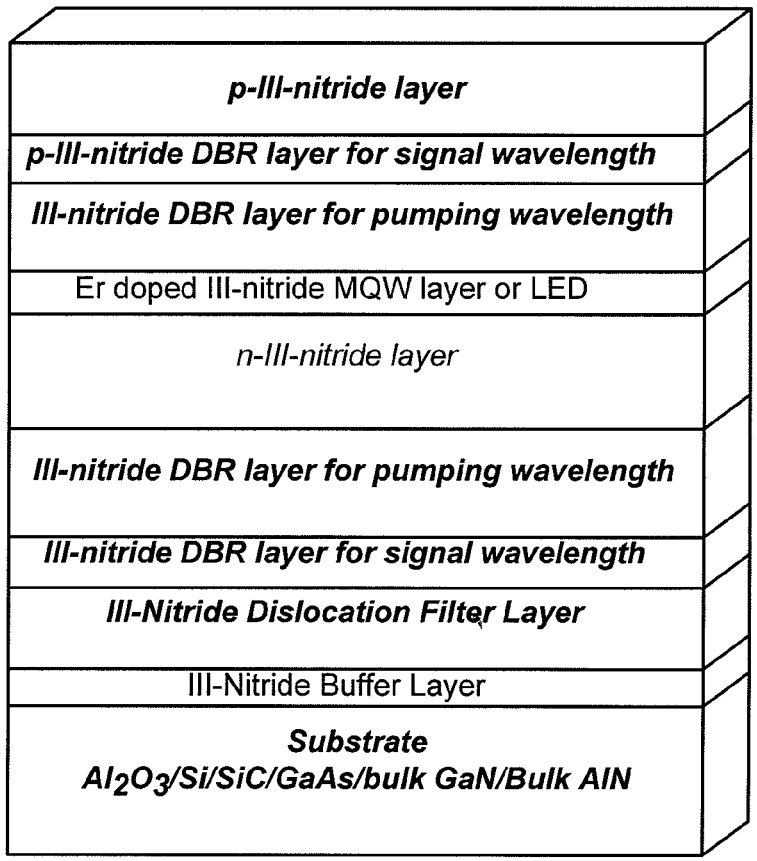

FIG. 12 General structure of an Er doped III-nitride emitter using DBR mirrors to enhance the Er based emission according to one embodiment of the present subject matter. The pumping wavelengths can be engineered to be at 410, 460, 500, and 538 nm for current injection, while the signal wavelength is about 1.54 µm. The DBR layers are employed in such a manner to achieve more emission from the side of the structure.

FIG. 13 General structure of a micro/nanoscale disk based upon Er doped III-nitrides according to one embodiment of the present subject matter. The mechanism for excitation of the Er centers is both optical and current injection. One can further employ a large undercut into the substrate by etching to create a narrow supporting post for the disks so that the disks are essentially sitting in free space to enhance the optical confinement.

FIG. 14 General structure of a micro/nanoscale ring based upon Er doped III-nitrides according to one embodiment of the present subject matter. The mechanism for excitation of the Er centers is both optical and current injection.

Figure 15:
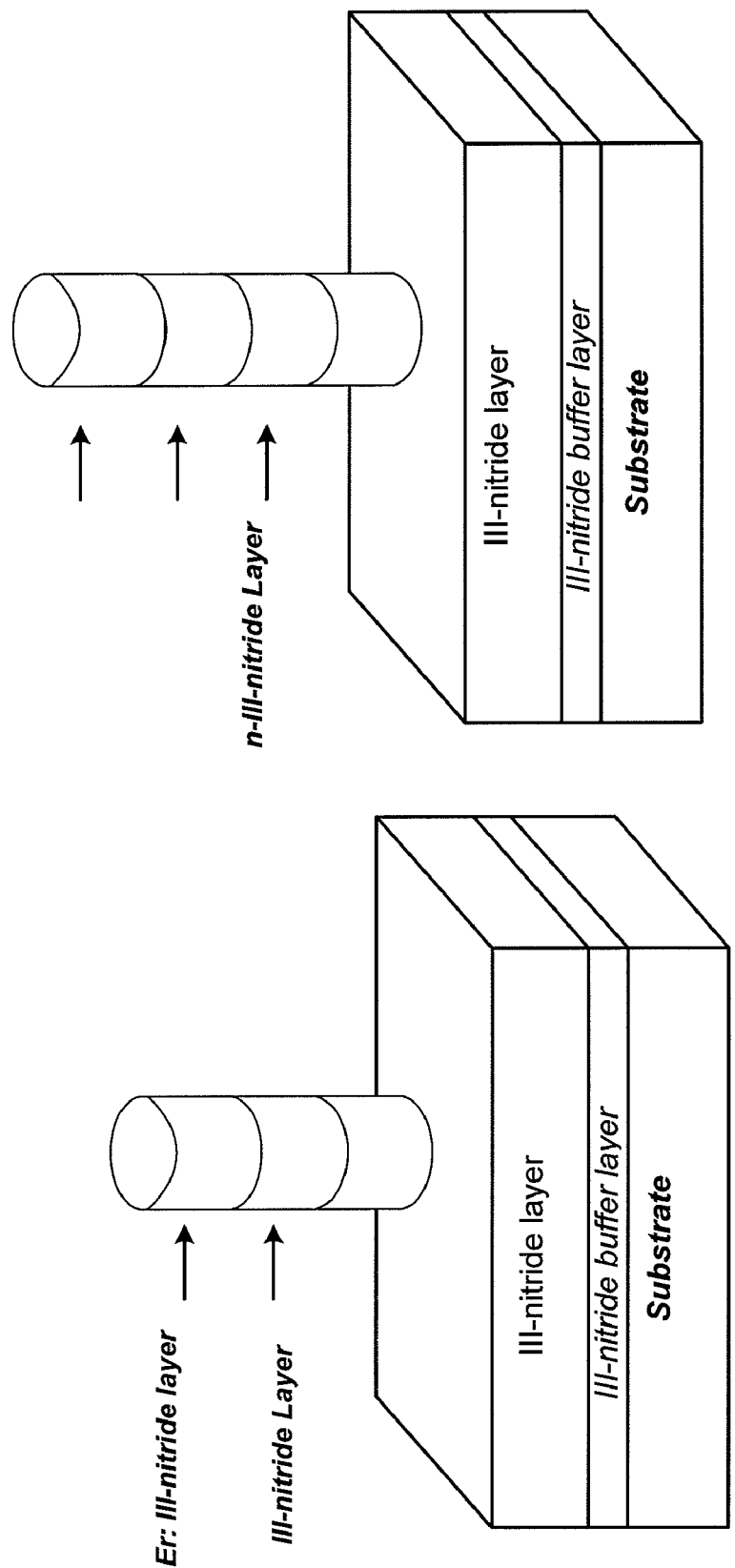

FIG. 15 General structure of a micro/nanoscale pillar or wire based upon Er doped III-nitrides according to one embodiment of the present subject matter. The mechanism for excitation of the Er centers is both optical and current injection.

Figure 16:
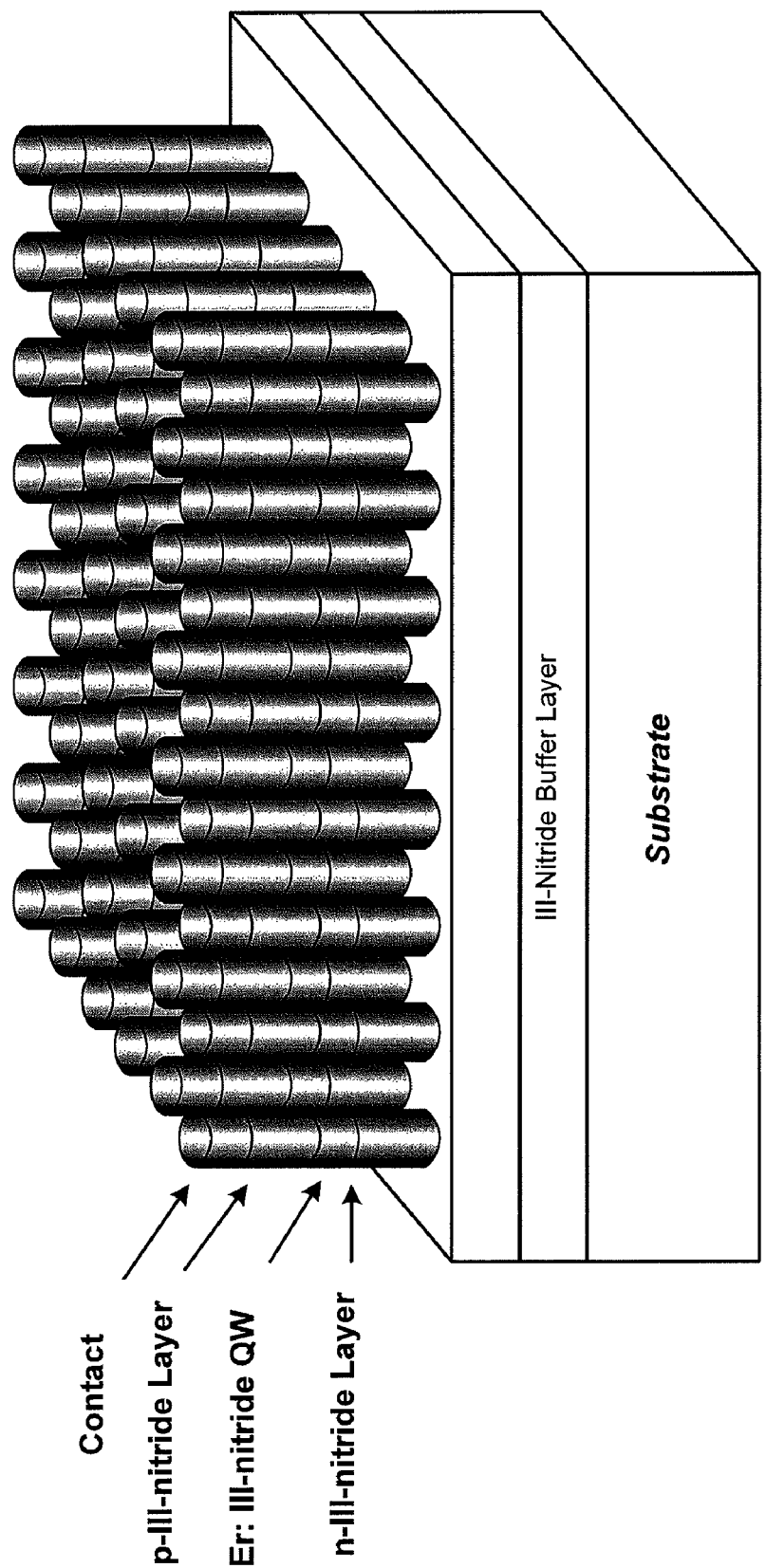

FIG. 16 General structure of an array of micro/nanoscale pillar or wire based upon Er doped III-nitrides according to one embodiment of the present subject matter. With the formation of n and p-contacts, the Er centers can be excited by current injection. One can further employ a large undercut into the substrate by etching to create a narrow supporting post for the pillars so that the pillars are essentially sitting in free space to enhance the optical confinement.

Figure 17:
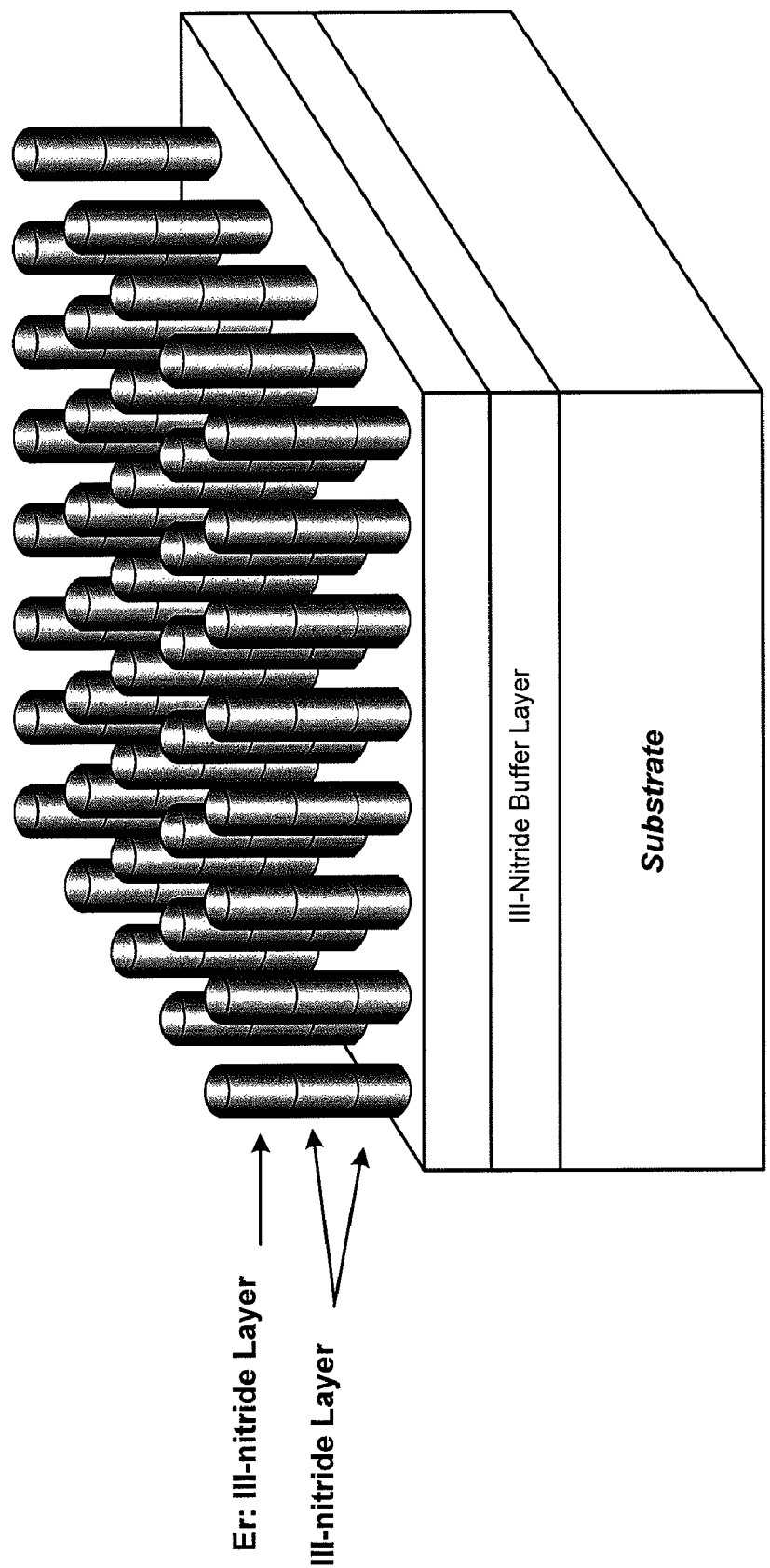

FIG. 17 General structure of an array of micro/nanoscale pillar or wire based upon Er doped III-nitrides according to one embodiment of the present subject matter. Without n and p-type contact formation, the Er centers can be excited optically. One can further employ a large undercut into the substrate by etching to create a narrow supporting post for the pillars so that the pillars are essentially sitting in free space to enhance the optical confinement.

FIG. 18 Room temperature photoluminescence spectrum of Er doped GaN grown by MOCVD under an excitation wavelength of 266 nm. The emission at 1.0 and 1.54 mm correspond to the radiative intra-4f $Er^{3+}$ transitions from the $^4I_{11/2}$ (second excited state) and the $^4I_{13/2}$ (first excited state) to the $^4I_{15/2}$ (ground state), respectively. The visible part of the spectrum is scaled by a factor of 4.

FIG. 19 Integrated PL emission intensity of the 1.54 µm peak versus sample temperature with $\lambda_{exc}$=263 nm. The results demonstrate the high degree of thermal stability of the $Er^{3+}$ emission. The integrated PL intensity of the 1.54 µm emission decreases between 10 and 300 K by only 20%.

Figure 20:
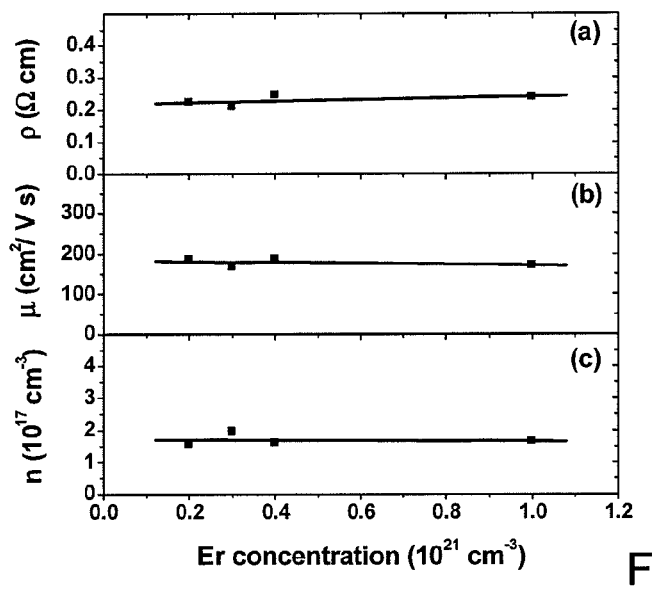
FIG. 20 plots (a) resistivity (ρ), (b) electron mobility (µ), and (c) free electron concentration (n) for embodiments.

FIG. 20 Plot of (a) resistivity ($\rho$), (b) electron mobility ($\mu$), and (c) free electron concentration (n) for Er doped GaN samples of varying Er concentration between $(0.2-1)\times10^{21}$ $cm^{-3}$. The results show that Er incorporation has very little effect on the electrical conductivity of the GaN epilayers and Er doped layers retain similar electrical properties as those of undoped GaN.

Figure 21:
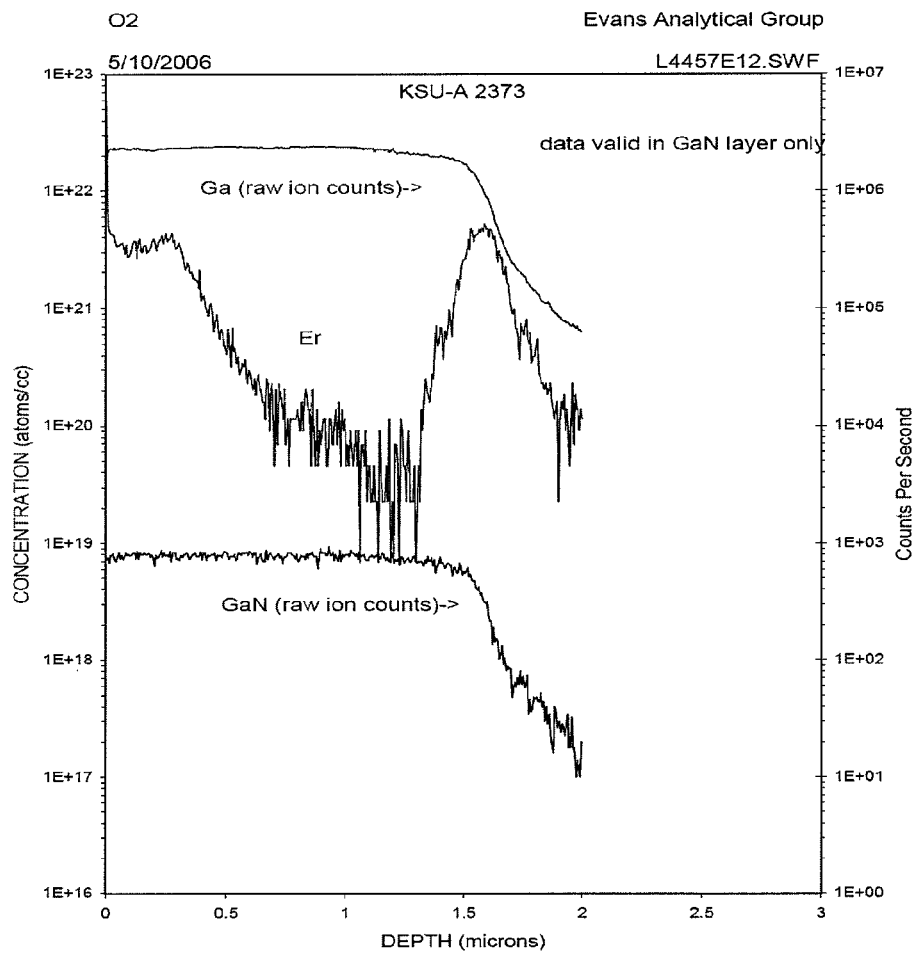
FIG. 21 plots Er concentration vs. layer thickness/depth of an Er doped GaN structure.

FIG. 21 Plot of Er concentration vs layer thickness for the Er doped GaN structure profiled by secondary-ion mass spectroscopy (SIMS) performed by Evans Analytical Group. The plot clearly shows concentrations of $4\times10^{20}$–$4\cdot10^{21}$ $cm^{-3}$.

III-nitride wide bandgap semiconductors are excellent host materials for rare earth elements including erbium (Er). Potential applications of rare earth doped nitride semiconductors include wave-guides, optical switches, optical amplifiers, light sources, detectors, and routers in the infrared (IR) wavelengths for optical communications.

Some possible applications are: the development of methods for in-situ doping of Er ions in the active region of nitride quantum well (QW) based emitter structures by the metal-organic-chemical-vapor-deposition (MOCVD) growth; the Development of erbium-doped nitride light emitting diodes (LEDs) emitting light at 1.5 µm; Investigation of possible mechanisms that would enhance the Er emission at 1.5 µm in Er-doped nitrides; and Exploration of the feasibility of fabricating electrically pumped waveguide optical amplifiers based on Er-doped nitride QWs.

The III-nitride wide bandgap semiconductors are recognized as technologically important materials for optoelectronics/photonics. Some applications are use with LEDs with emission wavelengths from ultraviolet (UV) to amber and blue laser diodes (LDs). Comprehensive technologies have been developed for the MOCVD growth of III-nitride materials and UV/blue micro- and nano-scale photonic device fabrication. However, very little work has been done on rare earth doped nitride material system, despite their great potential in the IR wavelength region for optical communication applications. Herein, the foundation is laid for achieving electrically-pumped waveguide optical amplifiers based on Er-doped III-nitride semiconductors, and the possibility has been opened up for developing a new generation of photonic integrated circuits, which would have a significant impact on DOD capabilities, especially in areas of sensing and communications, as well as on commercial applications.

Erbium doped materials have attracted a lot of attention for their potential applications in photonics, especially in the area of optical communications. Doped in a solid host, $Er^{3+}$ ion has allowable intra 4f shell transition from its first excited states ($^4I_{13/2}$) to the ground state ($^4I_{15/2}$). The transitions are very sharp due to the fact that filled 5s and 5p shells screen the partially filled 4f shell. The emission lifetime of the excited state can be as long as several milliseconds. With an emission wavelength at 1.55 µm, which corresponds to the minimum loss in silica fibers, Er-doped materials are ideal candidates as source and amplifier for fiber optical communications.

Er-doped fiber amplifier (EDFA) has been an established technology in long-haul fiber communications. Unfortunately, with a typical size of tens meters long, the optically pumped EDFA is difficult to be integrated with many other functional photonic devices, and the high cost limits it economically only for long-haul system. On the other hand, the inexpensive GaAs-based semiconductor optical amplifier (SOA) is electrically pumped and integrable, but noise and crosstalk limit the transmission rate to about 1 GB. The non-linear crosstalk is caused by the short carrier lifetimes, which is intrinsic to free carriers involved in the band-edge recombination in semiconductors. The optical amplifier based on Er-doped semiconductors, if successful, will be electrically pumped, integratable, and low cost, with the performance of linear gain, temperature insensitivity and low noise. These characteristics are extremely attractive for local- and wide-area networks, cable TV distribution, and anticipated new fiber-to-the-home (FTTH) applications where multiple amplification steps are required.

Group III-nitride wide bandgap semiconductors are recognized as technologically important materials for optoelectronics. The main applications have been in LEDs with emission wavelengths from UV to amber, and blue laser diodes (LDs). They are excellent photonic device materials due to their large energy bandgaps, highly efficient light emission, and the ability of bandgap engineering through the use of alloying and heterojunctions. Based on their intrinsic physical properties and recent experimental results, nitride semiconductors are also promising materials for fiber optical communications at 1.55 µm. The continuous variation of the refractive index of $Al_xGa_{1-x}N$ with x from 2.34 (x=0) to 2.03 (x=1) at 1.55 µm makes III-nitrides ideal candidates for optical waveguide devices. The GaN-based semiconductors are potentially superior to InP-based alloys due to the better index match with silica optical fibers. More importantly, erbium doped nitride materials possess advantageous properties of semiconductors—excitation of Er ions through electrical carrier injection. A superior thermal stability of Er emission is expected because of the wide energy gap of III-nitrides. Thus they could be the ideal light source and amplification materials for optical fiber communication systems.

In general, thermal stability of Er emission increases with an increase of the energy gap and the crystalline quality of the semiconductor host material. The III-nitride semiconductors appear to be excellent host materials for Er ions. Optical emission at 1.55 µm in Er-implanted GaN films has been observed. In particular, GaN and AlGaN epilayers doped with Er ions have demonstrated a highly reduced thermal quenching of the Er luminescence intensity from cryogenic to elevated temperatures, as compared to other semiconductor host materials such as Si and GaAs. The remarkable thermal stability of the Er emission may be due to the large energy bandgap of the III-nitride materials, as well as to the optical inactivity of material defects in III-nitride films. These properties may allow us to fabricate novel electrically pumped waveguide optical amplifiers that possess advantages of both SOAs (small size, electrical pumping, ability for photonic integration, etc) and EDFAs (minimal crosstalk between different wavelength channels in wavelength-division multiplexing (WDM) optical networks).

Furthermore, it would lead to the integration with other functional optical devices, such as wavelength routers, optical switches, light sources, and detectors, to build monolithic photonic integrated circuits (PICs). Due to their intrinsic robust physical properties, III-nitride based devices may operate at higher voltages and power levels, and in harsher environments than conventional III-V semiconductors.

Optical communication networks play an important role in the overall functioning of military weapons systems. Currently available WDM components and systems are predominantly constructed of fiber-coupled, discrete components. While offering a large degree of flexibility in system design, current technologies gives the resulting WDM modules a volume or "footprint" that is much too large for emerging military platforms. Another problem is that much of the available WDM component level technology has been designed for use in very high-speed digital optical communications networks suitable for the long-haul transport. A final obstacle to the use of conventional WDM components concerns temperature sensitivity. Some military platforms are severely limited in their ability to provide an environment with a stable temperature range or the power to support a large number of thermo-electric coolers. Future military platforms would see substantial benefit from WDM components that provide high levels of chip-scale integration, and are temperature robust [14]. The anticipated superior characteristics of Er-doped III-nitride based photonic components would provide crucial advantages for optical communication networks.

Other potential applications include: (i) electrically-pumped waveguide optical amplifiers using Er-doped III-nitrides which combine the advantages of both SOAs and EDFAs, and (ii) the development of new generation of PICs based on III-nitride semiconductors. These technologies might also allow for highly sophisticated communication networks with dense arrays of intelligent sensors. These networks would use PICs that would enable the integration of different photonic components (ranging from emitter, detector, resonator, to waveguide amplifier devices) on a single substrate and allow chip-scale information processing (covering from UV to IR) previously not possible with any other materials. The III-nitride PIC technologies would have a significant impact on telecommunications capabilities, especially in areas of sensing and communications, as well as on other commercial applications. The III-nitride materials have been at the central stage in the semiconductor research and development efforts over the last decade with the main focus on photonic devices operating in the visible and UV regions. That said, the disclosed technologies could expand the applications of III-nitride materials into the IR optical communication wavelength region and will have substantial impacts in the optoelectronics/photonics field with significant military and commercial applications.

Facilities

The facilities for making the disclosed MOCVD grown III-nitride materials and micro/nano-scale device fabrications include a laboratory equipped with MOCVD systems with the capability of producing wafers. These MOCVD systems are reconfigured specifically for the Er-doped nitride semiconductor materials growth. The laboratory is also fully equipped for device fabrication. The facilities include deep UV photo-lithography (with 0.25 µm feature resolution) and e-beam lithography with 30 nm/50 nm feature resolution for conducting/insulating substrates for device patterning, inductively coupled plasma (ICP) etching system for semiconductor dry etching, electron beam evaporator for metallization, plasma-enhanced chemical vapor deposition (PECVD) for dielectric materials deposition, and rapid thermal processor for semiconductor and metal contacts thermal annealing. For devices packaging, the laboratory is equipped with wafer thinning, dicing, wire-bonding and flip-chip bonding machines.

The material characterization facilities include picosecond time-resolved nano-optical spectroscopy, which is capable of probing optical properties with a time-resolution of a few ps, a spatial resolution of 50 nm, and wavelength range spanning from IR to deep UV (down to 195 nm, covering spectral range of pure AlN) and is the "eye" for monitoring the material quality of $Al_xGa_{1-x}N$ alloys with high Al contents.

An Energy Dispersive X-ray (EDX) microanalysis system is used for compositions analysis. A variable temperature Hall-effect measurement system with high temperature capability (10 K<T<900 K) is available for transport measurement. Other characterization facilities include the scanning electron microscopy (SEM), atomic force microscopy (AFM), and x-ray diffraction (XRD) measurement systems.

Passive Waveguide Devices

To explore the possibility of developing new PICs based on III-nitride semiconductors for fiber-optical communications, the first step is to investigate the waveguide properties of nitride materials. A 3-dB GaN/AlGaN heterostructure optical waveguide coupler has been designed, fabricated and characterized.

Referring to FIGS. 24A-B, it can be seen that an Optical waveguide design for optical communications using GaN/$Al_xGa_{1-x}N$ heterostructure grown on sapphire substrate. (a) Waveguide cross-section, (b) simulated single-mode pattern, and (c) relative radiation intensity versus exit angle.

Referring to FIGS. 25A-B. (a) Optical microscopy images of a 2×2 GaN/AlGaN heterostructure optical waveguide coupler, including top view and cross-section at the output. (b) Measured output optical power versus the probe displacement in the horizontal direction of the waveguide coupler. The input optical signal was launched at Port 1.

Er-Doped Nitride Light Emitters

Figures 26A, 26B:
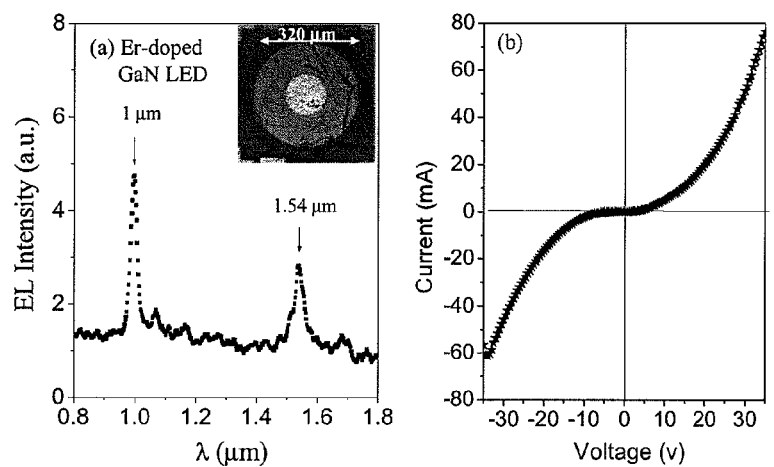

Herein we have successfully synthesized and characterized AlGaN/GaN:Er/AlGaN double heterostructures (DHs) grown through a combination of MOCVD (by KSU) and MBE (by SVT). The $Al_{0.12}Ga_{0.88}N$ barrier layers were prepared by MOCVD and the Er-doped GaN layers with a thickness of 50 nm grown by MBE. It was shown that the IR emission line around 1.5 µm from this structure exhibited a marked improvement compared to the uncapped films. The enhanced photoluminescence (PL) emission property may be due to more effective confinement of electron-hole (e-h) pairs in the QW region, which results in a more efficient energy transfer of e-h pairs to the Er ions, since the photo-excited e-h pairs need to be located close to the Er ions for an effective energy transfer. Another mechanism of IR emission in AlGaN/GaN:Er/AlGaN QW structures is that the short wavelength photons generated by the AlGaN/GaN QW act as the pump for the erbium, which enhances the population inversion of the erbium ions in the related energy levels and helps the emission of photons in the IR wavelength regions. Based on the results obtained by optical pumping, we have fabricated and demonstrated the operation of the first 1.5 µm current injection LED device based on p-AlGaN/GaN:Er/n-AlGaN double heterostructure and obtained interesting preliminary results. FIG. 26A shows the low temperature (10 K) electroluminescence (EL) spectrum measured in the infrared region under reverse bias. Two lines at 1000 nm and 1540 nm are prominent. The inset of FIG. 26A shows an optical microscopy image of a fabricated LED with a diameter of 320 µm. FIG. 26B is the I-V characterization. The temperature dependence of the peak EL intensity of these infrared lines is also measured. As found in previous studies, the peak EL intensity of these lines is inversely proportional to the ambient temperature. The observed EL decrease of ~38% from 10K to 300K is slightly higher than the reported photoluminescence decrease in Er-doped GaN. These initial results are promising, but clearly a lot of efforts are required to achieve the emitter device for real applications, including the host material quality improvement, device structural design, $Er^{3+}$ emission mechanism study and emission enhancement, etc.

Great challenge is associated in incorporating Er ions into LED junctions to produce 1.5 µm emissions. Comparing with implantation, in-situ doping provides precise control of Er dopants position in the device structure. In contrast with other epitaxial growth techniques, MOCVD is the established growth method in III-nitride semiconductor industry, and almost all the commercial nitride photonic devices are grown by MOCVD technology. Furthermore, almost all the commercialized nitride photonic devices are based on QW structures. Here we have developed methods for in-situ doping of Er ions in the active region of nitride QW based emitter structures by MOCVD growth. By doping Er in the QW, the more effective confinement of e-h pairs in the QW region may lead to a more efficient energy transfer from e-h pairs to the Er ions to enhance the IR emission.

A. Er-Doped III-Nitride QW Structures by MOCVD Growth

Figure 27A:
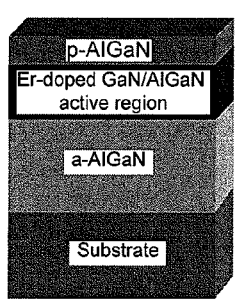
Figure 27B:
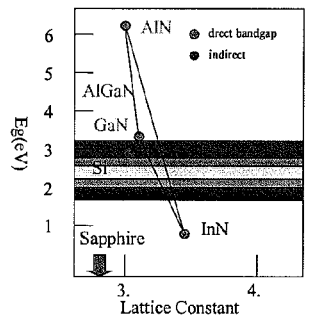

For optical communication and other applications, IR optical sources and amplifiers based upon Er doped III-nitrides must have high efficiency, and passive waveguides and switches have low optical loss. The quality of these photonic devices can be improved and the performance degradation can be reduced with further improvements in materials quality and device structural design. The IR-light source in this proposed project would be based on Er-doped nitride QW structures, as shown in FIG. 27A. The related materials lattice constant and bandgap are shown in FIG. 27B. In this structure, n- and p-type AlGaN are the barrier layers of the QW, and provide electrons and holes injection. Er ions are in-situ doped in the QW active region during MOCVD material growth. The well layer is GaN or AlGaN with low Al composition. The underlying principle for this design is that the injected electrons and holes will be effectively confined in the QW region, and their energy can be more efficiently transferred to the Er ions, which are doped right in this region.

Figure 27C:
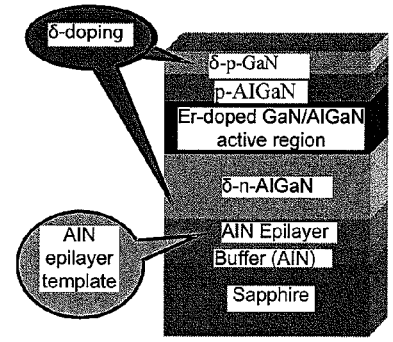

Specifically, FIG. 27A shows a basic layer structure of Er-doped emitters based on GaN/AlGaN QWs; FIG. 27B shows bandgap energy of III-nitrides as a function of lattice constant showing that AlN has a better lattice matching with sapphire substrate than GaN; and FIG. 27C proposed layer structure of Er-doped nitride QWs, in which a high quality AlN epilayer is used to reduce the lattice mismatch between sapphire and subsequent device layers, to provide an atomic flat template, and to act as dislocation filter. δ-doping is employed in n- and p-type layer to further enhance the conductivity and reduce dislocation density.

To accomplish these structures, two challenging issues were addressed. One is material quality and the other is Er in-situ doping. The thermal stability of Er emission will be enhanced with an increase of the crystalline quality of III-nitride host material. Thus, it was necessary to find effective methods to reduce dislocations generated during the epitaxial growth. We propose here several methods to further reduce defect density in AlGaN and GaN QWs. These methods have been recently incorporated into III-nitride based blue and UV photonic devices and will be incorporated into Er doped QW structures. More specifically, the methods involve: (a) inserting a high quality undoped AlN epilayer template for subsequent active layer growth; (b) incorporating delta doping/pulsed growth scheme; and (c) using off-axis sapphire substrates. The targeting material structure is like the one shown in FIG. 27C. Then the reactor setup is optire is further optimize the reactor setup for in-situ doping of Er ions. The insertion of a high quality AlN epilayer template for subsequent device structure growth and incorporation of delta-doping is believed to further optimize III-nitride materials with reduced crystal defect density and enhanced n- and p-doping level.

A1. Optimizing MOCVD Reactor Configuration for Er Doping

Systems were optimized for Er doping by converting an existing MOCVD reactor for the growth of rare-earth doped nitrides. A conventional MOCVD system can be modified to use 5 metal-organic (MO) sources, Trimethylgallium (TMGa), Trimethylaluminum (TMAl), Trimethylindium (TMIn), Bis(cyclopentadienyl)magnesium ($Cp_2Mg$) and Tris (n-butylcyclopentadienyl)Erbium [$Er(thd)_3$], two gas lines, $NH_3$ and $SiH_4$. All the MO sources in the system are temperature and pressure controlled to ensure constant vapor delivering, and all gas flows are controlled by mass flow controllers. Since there are no existing literatures on in-situ doping of Er ions into semiconductors by MOCVD process, it will be necessary to optimize the reactor configuration for improved doping efficiency in III-nitride epilayers and QWs.

MO source materials (Epichem Inc) are held in stainless steel bubblers mounted in temperature-controlled baths with a temperature controlled within $0.1°$ C. The purest available MO sources (adduct grade) are used to obtain materials with high purity. The temperatures of TMGa, TMAl, TMIn, and $Cp_2Mg$ are set at 0, 16, 20, and $20°$ C., respectively. The temperature of the Er MO source, $Er(thd)_3$, is set at $25°$ C. However, the optimized setting temperature is unknown at this point and we will need to carry our systematic studies in order to determine the temperature for the most efficient incorporation of Er ions. The resultant source vapor is then carried by purified hydrogen gas via a mass flow controller to the manifold of the MOCVD system.

Process gases (MO source, $NH_3$, and $SiH_4$) are directed to the reactor at precisely controlled flow rates through the manifold. The manifold is used for efficiently switching reagents between a vent line and the reactor. Specially designed 3-way and 4-way valves are used to construct the manifold. The dead volume of the valve is almost zero, so it is possible to rapidly switch between different MO sources and allow the growth of quantum wells with an atomic precision layer thickness control.

A2. AlN/Sapphire Templates

We have successfully achieved the epitaxial growth of high quality AlN epilayers with very smooth surface morphology [22-25]. By inserting an AlN epilayer template (about 1 μm) prior to the growth of n-type AlGaN or n-GaN, we have achieved a marked improvement in the overall quality (crystalline quality, surface morphology, PL intensity, conductivity, etc) of the n-AlGaN or n-GaN epilayers as compared to the n-type epilayers grown directly on sapphire with a low temperature AlN buffer layer. The improvement is due to the fact that AlN epilayer has a better lattice match with sapphire than GaN (as shown in FIG. 27B) and the capability to provide an atomically flat template for subsequent growth of the device structure. The strain between the AlN template and the subsequently grown AlGaN or GaN layer will bend the threading dislocation, so the dislocation density propagating through the subsequently grown layer is dramatically reduced by one to two orders. In other words, the high quality AlN epilayer acts as a dislocation filter for the subsequent growth of n-AlGaN or n-GaN. It was previously shown that GaN epilayers grown on AlN/sapphire templates have a low dislocation density compared with the GaN grown directly on sapphire using low-temperature GaN buffer [26]. We have demonstrated that AlGaN UV LEDs grown on the AlN/sapphire template exhibited a higher output power and a better thermal stability compared to the UV LED grown on sapphire using a low-temperature GaN buffer layer [27]. This is due to the reduced threading dislocation density in the active layer and higher thermal conductivity of AlN epilayer [28]. It is believed that the MOCVD growth conditions for III-nitride materials and Er doped LED structures grown on AlN-epilayer/sapphire template can be further optimized for improved quality. Off-axis sapphire substrates together with multi-buffer layers could be used to further enhance the material quality and to reduce the generation of native defects. The use of off-axis sapphire substrates was shown to be effective in restraining the generation of inversion domains and hence reducing the dislocation density in AlN due to the ease in strain relaxation. We will explore the feasibility for growing AlN epilayers at extreme conditions—high temperatures ($>1300°$ C.) and low V/III ratios ($<10$). The overall quality of the AlN template will be enhanced by varying key growth parameters such as: (i) sapphire substrate miscut angle; (ii) multi-buffer layer thickness and growth temperature; and (iii) epilayer growth parameters such as temperature, pressure, V/III ratio, and growth rate.

A3. The n- and p-Type δ-Doping Scheme

Figures 28A, 28B:
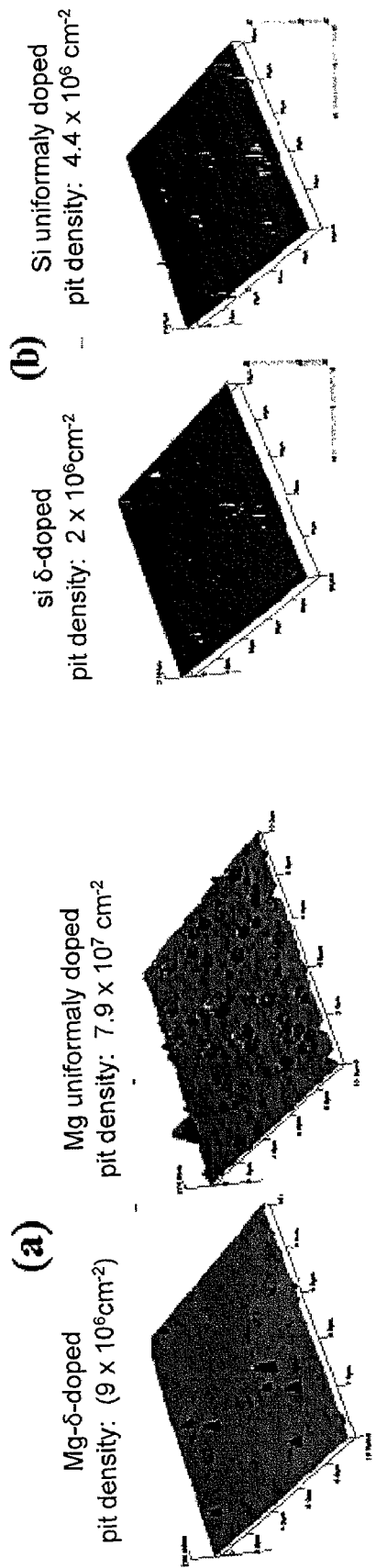
FIG. 28 shows pit density displays for embodiments.

Recently, it was also shown that δ-doping enhances both the conductivity and material quality of GaN and AlGaN epilayers. A δ-junction-like doping profile can be implemented by interrupting the usual crystal-growth mode by closing the Ga (and Al) sources flow and leaving the N ($NH_3$) flow continuously. The N-stabilized crystal surface is thus maintained while the Mg (Si) impurities are introduced into the growth chamber so that an impurity-growth mode results. FIGS. 28A and 28B show the AFM morphologies of etched layers of (a) Mg-δ-doped and uniformly doped p-type $Al_{0.07}Ga_{0.93}N$ and (b) Si-δ-doped and uniformly doped n-type GaN, which clearly demonstrate a drastic reduction of dislocation density (or etch pit density) in δ-doped epilayers. For example, the AFM images indicate that the etch pit density decreases almost by one order of magnitude from $7.9\times10^7$ $cm^{-2}$ in uniformly Mg-doped layer to $0.9\times10^7$ $cm^{-2}$ in Mg-δ-doped layer. The results thus strongly suggest that δ-doping can reduce dislocation density and hence improve the overall material quality of III-nitrides in general. Additionally, δ-doped GaN epilayers exhibits much improved electrical properties over uniformly doped layers. Our results on p-type GaN have shown a 5-fold reduction in vertical resistivity in Mg-δ-doped p-type layers compared with uniformly Mg-doped p-type layers. This will be extremely beneficial to the performance of Er doped III-nitride emitters in which vertical transport is more critical.

It is believed the optical, electrical, and structural properties of δ-doped layers, especially those of p-type, can be optimized further. We will monitor dislocation density by studying the surface morphologies of Mg-δ-doped GaN and AlGaN epilayer and emitter structures by SEM and AFM. Time-resolved PL measurements will be employed to monitor the relative density of non-radiative recombination centers in Mg-δ-doped vs. uniformly doped films. The electrical transport properties will be monitored by variable temperature Hall-effect measurements to identify the optimal growth conditions for Mg-δ-doping. In particular, we will measure the Mg impurity parameters (thermal activation energy, free hole concentration, etc) for varying doping conditions. This will be accomplished by measuring the band-to-impurity emission spectral positions, the temperature dependence of the PL emission intensity, and the temperature dependence of the free hole concentration, mobility, and conductivity. Detailed studies will be carried out for Mg-δ-doped films by varying (i) the distance between the two δ-planes; (ii) Mg doping concentration in each δ-plane; and (iii) Mg flow rate, as well as Mg flow time, Ga or Al flow time, and the time delay between the closure of Mg flow and the launch of Ga or Al flow.

A4. In-Situ Er-Doping

During MOCVD growth, $Er(thd)_3$ vapor, as Er source, is transferred into the reactor by carrying gas ($H_2$). When it diffuses to the hot substrate, $Er(thd)_3$ decomposes and Er atom incorporates into the growing film. The dopants density will depend on the Er source vapor pressure and flow rate. It is generally considered that most Er dopants locate at Ga(Al) sublattice sites.

For the in-situ Er-doped QW structure growth, three interweaved issues have to be addressed: (1) Er dopants sheet density; (2) the incorporation of Er dopants on optically active sites; and (3) an efficient mechanism for the excitation of $Er^{3+}$ intra-4f shell emission by injected e-h pairs. A low doping density will not ensure the IR-emission intensity, especially if the energy transfer and emission efficiency is low; on the other hand, the doping sheet density is also limited by Er solubility, the QW thickness, and influence on the GaN/AlGaN crystal structure quality. QW thickness, or using multiple QWs, will be adjusted in our study.

From photoluminescence study, it has been found that in Er-implanted GaN, Er-defect/impurity complexes dominate the $Er^{3+}$ emission excited by above-gap excitation, while the isolated $Er^{3+}$ substituted isovalently on a Ga site has too small cross-section to capture the e-h energy [17]. With the aid of PL and EL study, our material growth will address these issues by changing Er dopants environment. Some possible approaches include specifically introduced defects, co-dopants such as Er+Mg, Er+Si, or Er+O, or varying strain to form clusters in the well.

B. $Er^{3+}$ Dopants Luminescence Study

The emission properties of Er ions can be thoroughly investigated by PL spectroscopy. With optical excitation below and above the nitride bandgap energy, the influence of defects and impurities (such as O, C, and H) on $Er^{3+}$ light emission properties will be investigated. With the understanding of its energy transfer and emission mechanism, possible approaches, such as impurity incorporation and nitride alloy composition variation, which may be able to enhance the $Er^{3+}$ light emission will be developed.

For the proposed LED device, under forward bias, $Er^{3+}$ excitation is through the energy transfer from injected e-h pairs. The energy transfer process most likely involves some intermediate defect levels in the nitride host. Through luminescence study, we should identify the effective intermediate levels, through which the energy can be transferred from e-h pairs to $Er^{3+}$. The knowledge gained from these studies will be useful in guiding MOCVD material growth and doping. For example, if it is necessary, we can intentionally introduce some energy levels by co-doping with other elements.

C. Er-Doped Nitride Light Emitter Fabrication

Figure 29A:
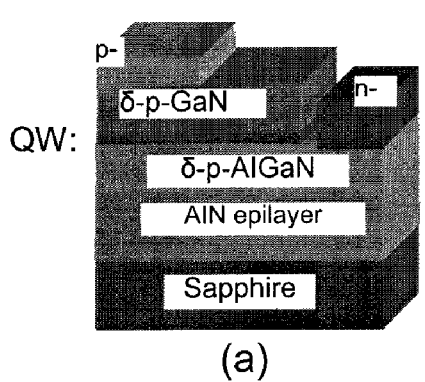
FIG. 29 shows packaging configurations.

The material structure and device fabrication of Er-doped nitride emitters with emission wavelength at 1.55 µm will be developed, based on our experience of nitride green, blue, UV, and DUV light emitting diodes. The basic device structure is shown in FIG. 29A. The fabrication starts from mesa pattern definition and ICP plasma etching down to n-type AlGaN layer, followed by e-beam evaporated Ti/Al/Ti/Au metal stack on the n-AlGaN layer. With rapid thermal annealing (RTA), the metal stack will form n-contact. Typically, to form ohmic-contact on p-GaN and reduce the current crowding effect caused by the low conductivity of p-GaN, very thin Ni/Au metal is deposited on p-GaN mesa surface, followed by thermal annealing in oxygen-containing environment. The resulted NiO/Au forms p-contact and current spreading layer. Although the use of the current spreading layer together with p-contact decreases the current crowding effect, it also partially blocks the light emission.

Figure 29B:
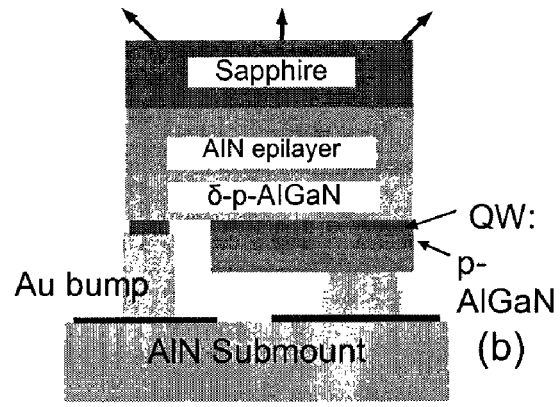

Based on our UV emitter experience, depending on the detailed material structure (Al composition in AlGaN) and the input power level, we may also have to tackle the thermal dissipation and current crowding issues for Er doped nitride emitters. One option is to adopt flip-chip bonded device packaging scheme, with optimized device geometry design, as illustrated in FIG. 29B. With flip-chip packaging, the IR emission will be extracted from the transparent sapphire substrate side instead of p-layer side, so the optical emission block by current spreading layer and n- and p-contacts will be eliminated, which is one of the benefits of flip-chip bonded packaging. Another benefit of flip-chip bonded packaging is the enhanced heat dissipation capability.

The device performance under the forward bias with electrons and holes injection, and the reverse bias with the impact excitation of $Er^{3+}$ ions by high energy electrons collisions will be investigated for a further understanding of the excitation mechanism of Er-doped nitride materials.

Analysis of the optical properties of AlGaN/GaN:Er/AlGaN QW structures in the IR wavelength region, as growth and post-growth annealing conditions are varied is important. Seeking mechanisms that would enhance the Er emission around 1.5 µm is being explored. Some methods include optimizing the QW structural design to enhance the confinement of electron-hole pairs in the well region, as well as a more efficient energy transfer of e-h pairs to the Er ions, and optimizing the growth conditions by varying growth temperature, pressure, etc. as well as device structural parameters such as well thickness and Er doping concentration. The L-I and I-V characteristics are systematically measured.

D. Er-Doped Nitride Waveguide Optical Amplifier

As an important part of our study, we will investigate the effect of optical confinement by using single mode optical waveguide. The collinear propagation of the short wavelength optical pump and the IR optical signal in the same waveguide will significantly enhance the pump efficiency. In addition, another way to further enhance the pump efficiency is to introduce the resonance effect for the pump in the waveguide by applying wavelength selective coatings at both end of the waveguide. These coatings provide high reflectivity for the short wavelength pump and thus prevent the pump power from leaking out, and simultaneously provide low reflections for the IR wavelength to ensure traveling-wave type amplification for the optical signal. In such an arrangement, the pump photons may be confined within the waveguide until they are fully absorbed by the erbium. On the other hand, the waveguide will operate as a traveling wave optical amplifier for the IR signals.

By incorporating Er ions in integrated optical circuits based on III-nitride, the optical loss introduced by the optical circuits will be compensated. This in turn allows more sophisticated PIC devices for optical signal processing and optical switching. Although InP-based PIC may be integrated with semiconductor optical amplifiers made by InGaAsP for operating in the 1.5 µm wavelength region, the carrier lifetime in such optical amplifiers is typically in the sub-nanosecond level. Crosstalk between different wavelength channels caused by cross gain saturation remains a major limitation for the application of SOAs in WDM optical systems. In Er doped AlGaN/GaN:Er/AlGaN QW structure, on the other hand, since the carrier lifetime of the Er is in the order of milliseconds, the crosstalk will be too slow to affect any optical channels with the data rate higher than 10 KHz.

Indeed, this is one of the major reasons why current WDM optical systems predominately used EDFAs even though they are not integratable with other photonic devices. The only effect of gain saturation in Er-doped optical amplifiers is to reduce the average optical gain for all the channels.

When compared to EDFAs, the Er-doped GaN amplifiers have the following advantages. First, they have compact size. Er ions in III-nitrides would have much higher absorption efficiency at shorter wavelengths (the band-to-band recombination in GaN host crystal around 3.4 eV serves as an excitation source for Er ions in this case), that makes the absorption length much shorter compared to pumping at 980 nm. Another advantage is that the devices use Electrical pumping instead of optical pumping. This will make the optical amplifier much simpler in the optical configuration. Further, Optical integration of functional devices will be possible. This is an important step towards all-optical integrated circuits.

When compared to InGaAsP SOAs, the Er-doped GaN amplifiers have the following advantages. First, they will have low crosstalk. Er ions have much longer carrier lifetime, which makes the optical gain saturation a very slow process. In high-speed optical systems, this will eliminate the inter-channel crosstalk. Additionally, they have lower spontaneous emission noise and thus lower noise figure for optical amplification in IR wavelength region. Usually, a 980 nm pumped EDFA has a lower noise figure than a 1480 nm pumped EDFA, the reason is that erbium has a higher absorption cross-section in 980 nm. Since the absorption cross-section of erbium at 510 nm is even higher, we may expect a lower noise figure. However, this point needs to be experimentally verified.

D1. Optimizing Waveguide Fabrication Process

The usual method to pattern the optical waveguide devices is deep UV photolithography together with pattern transfer using ICP etching. Deep UV lithography is currently the most versatile techniques for producing sub-micron structures with controlled sizes and features. Several issues must be addressed that will affect the overall quality of the device structure. For example, the lift-off and pattern transfer with ICP etching processes. In order to obtain final structures with sharp features, an undercut resist profile is often needed for lift-off. We will employ the two-layer method for creating an undercut profile. The first approach is to use two layers of resist with different dissolution rates. In this case, both layers will receive the same amount of exposure dose, but the top resist layer develops at a slower rate than the underlying layer, resulting in a strongly undercut profile. Alternatively, we will also employ two chemically different resists that can be developed by the same chemical compound, in which the underlying layer is blanket exposed and only the top layer is used for patterning.

We will also further optimize the mixture of processing gasses for ICP etching. The plasma chemistry and etching induced damage will be monitored and studied by optical emission spectroscopy, SEM, and AFM. Time-resolved PL spectra will be measured before and after waveguide formation. These characterization techniques together provide an ideal vehicle for the identification of optimum etching processes. A gentle wet etching process in solutions such as $KOH:H_2O$ will be employed to improve the surface morphology of the etched surfaces. These methods together can tailor the waveguide profile to satisfy desired properties, including high verticality and smooth etched surface. A $SiO_2$ or $Si_3N_4$ dielectric layer may be deposited on the waveguide surface to further reduce the optical loss.

D2. Optical and Electrical Pumping of Er-Doped Waveguide Amplifier

Figure 30:
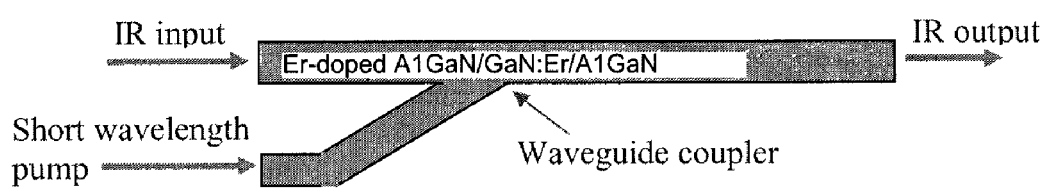
FIG. 30 shows a waveguide coupler arrangement which might be used.

FIG. 30 shows a waveguide configuration for the investigation of collinear interaction between pump and IR signal in Er-doped AlGaN/GaN:Er/AlGaN heterostructures. To study optical pumping, we have designed a straight optical waveguide with a waveguide coupler, which allows the injection of the short wavelength pump as shown in FIG. 30. Without the IR input, the IR output will be generated only due to the spontaneous emission. By adjusting the pump power and pump wavelength, output spontaneous emission will be measured in the IR wavelength region to evaluate the pump efficiency. In addition, the time domain response of the IR spontaneous emission will be measured by employing time-resolved spectroscopy with pulsed laser excitation to evaluate the carrier lifetime. Then, with the use of the IR input, we will be able to evaluate the stimulated emission efficiency by measuring the IR signal amplification. Through this measurement, signal optical gain, gain bandwidth as well as the effect of gain saturation will be fully characterized as the function of pump power and pump wavelength. These studies are essential for fully understand the impact of Er in the structure. The results of these measurements will provide feedback to help material growth and process optimization.

Observation of the disclosed devices has revealed IR emissions around 1.55 μm in our MOCVD grown layer. PL spectra of our Er doped GaN grown by MOCVD show predominantly IR emission lines at 1 μm and 1.55 μm (no emission lines in the visible spectral region). However, 1 μm emission line has higher intensity than the 1.55 μm line.

This is in sharp contrast to Er-doped III-nitrides prepared by other methods such as Er incorporation by ion implantation, in-situ doping by MBE, in which emission lines in the visible spectral region are dominant. Furthermore, Er doped nitride materials obtained by MBE or ion implantation are highly resistive, while MOCVD grown nitrides remain conductive and the Er concentration has a very little effect on the conductivity (or resistiviy). Several reasons may account for the differences: (i) Er ions have low solubilities in semiconductors, relatively high temperature growth is needed to obtain sufficient Er ion incorporation. Since the growth temperatures of MOCVD are much higher than those of MBE, so the efficiency for Er incorporation is higher for MOCVD growth. Compared with in-situ techniques, ion implantation is least efficient for Er ion incorporation; (ii) MBE is a non-equilibrium growth technique, while MOCVD is more close to a equilibrium growth technique. Er ions after incorporation may occupy different sites for MOCVD growing materials compared to those grown by MBE. It is well known in the nitride field that MOCVD grown III-nitride materials generally have higher material quality than those obtain by other methods. In our MOCVD grown III-Nitrides material, exciton and band edge transition lines are usually highly efficient. Maybe the photoexcited excitons and electron-hole pairs provide more efficient mechanisms for energy transfer to Er3+ centers than other impurity related lines. The MOCVD reactor has been modified to achieve a very low pressure and high temperature for the Er bubbler. The pressure of the Er bubbler is almost the same as that of the reactor, thereby allowing high Er incorporation rate.

The MOCVD growth processes has been further improved by further reducing the pre-reaction of the Er precursor with other metal organic sources and $NH_3$. This was accomplished by installing a separate line for the Er source all the way to the entrance of the reactor so that the Er-precursor will not mix with other sources until inside the reactor. As a result, we have obtained Er doped GaN epilayers with improved surface morphologies. More importantly, the emission line around 1.55 µm becomes predominant over the 1.0 µm line (see PL spectra enclosed). Again no visible emission lines were observed. We believe this is significant, because 1.55 µm corresponds to the minimum loss in silica fibers. Further, it is believed that Er-doped III-nitride semiconductors that emit only the 1.55 µm line do not exist conventionally.

The invention claimed is:

1. An apparatus for preparing an erbium-doped III-V semiconductor device capable of optical amplification in the 1.54 micron wavelength band, the apparatus comprising:
   an erbium bubbler for providing an organic erbium vapor in hydrogen; (support paragraph 19)
   a metal-organic chemical vapor deposition (MOCVD) reactor;
   sources for at least ammonia and additional organometallic compounds, the ammonia and additional organometallic sources coupled to provide additional organometallic vapors and ammonia to the reactor;
   the additional organometallic compounds including gallium compounds; and
   a pipeline extending from the erbium bubbler to the reactor, the pipeline separate such that the organic erbium vapor does not mix with the ammonia and additional organometallic compounds until the erbium vapor, ammonia, and additional organometallic compounds are inside the reactor.

2. The apparatus of claim 1 configured to maintain a pressure of the erbium bubbler nearly the same as a pressure of the deposition reactor during incorporation of erbium into III-Nitride materials by MOCVD.

3. The apparatus of claim 2, wherein the reactor is configured with sources for organometallic compounds of indium, gallium, aluminum, and magnesium.

4. The apparatus of claim 2, wherein the erbium bubbler provides vapors of Tris(n-butylcyclopentadienyl)Erbium.

5. An optical amplifier for the 1.54 micron band comprising
   An erbium-doped material III-N material comprising gallium;
   The III-N material having a stronger emissions peak at 1.5 microns than at 1.0 microns;
   Excitation apparatus selected from the group consisting of a light source and current injection excitation apparatus.

6. The optical amplifier of claim 5 comprising a quantum well structure.

7. The optical amplifier of claim 6 wherein the excitation apparatus comprises a light source providing light comprising at least light at 980 nm, 800 nm, 661 nm, 538 nm, 500 nm, 460 nm, or 410 nm wavelength.

8. The optical amplifier of claim 6 fabricated using an MOCVD apparatus comprising
   an erbium bubbler for providing an organic erbium vapor in hydrogen; (support paragraph 19)
   a metal-organic chemical vapor deposition (MOCVD) reactor;
   sources for at least ammonia and additional organometallic compounds, the ammonia and additional organometallic sources coupled to provide additional organometallic vapors and ammonia to the reactor; and
   a pipeline extending from the erbium bubbler to the reactor, the pipeline separate such that the organic erbium vapor does not mix with the ammonia and additional organometallic compounds until the erbium vapor, ammonia, and additional organometallic compounds are inside the reactor.

9. The optical amplifier of claim 6 having current injection excitation apparatus comprising a III-nitride emitter comprising aluminum and gallium adjacent a Er-doped III-N waveguide.

10. The optical amplifier of claim 9 fabricated using an MOCVD apparatus comprising
   an erbium bubbler for providing an organic erbium vapor in hydrogen; (support paragraph 19)
   a metal-organic chemical vapor deposition (MOCVD) reactor;
   sources for at least ammonia and additional organometallic compounds, the ammonia and additional organometallic sources coupled to provide additional organometallic vapors and ammonia to the reactor; and
   a pipeline extending from the erbium bubbler to the reactor, the pipeline separate such that the organic erbium vapor does not mix with the ammonia and additional organometallic compounds until the erbium vapor, ammonia, and additional organometallic compounds are inside the reactor.

* * * * *